(12) United States Patent
Kim et al.

(10) Patent No.: US 10,181,476 B2
(45) Date of Patent: Jan. 15, 2019

(54) SEMICONDUCTOR MEMORY DEVICES AND METHODS FOR MANUFACTURING THE SAME

(71) Applicants: Jongwon Kim, Hwaseong-si (KR); Keejeong Rho, Hwaseong-si (KR); Jin-Yeon Won, Seoul (KR); Tae-Wan Lim, Suwon-si (KR); Woohyun Park, Seoul (KR)

(72) Inventors: Jongwon Kim, Hwaseong-si (KR); Keejeong Rho, Hwaseong-si (KR); Jin-Yeon Won, Seoul (KR); Tae-Wan Lim, Suwon-si (KR); Woohyun Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 198 days.

(21) Appl. No.: 15/087,127

(22) Filed: Mar. 31, 2016

(65) Prior Publication Data
US 2016/0293627 A1    Oct. 6, 2016

(30) Foreign Application Priority Data

Mar. 31, 2015  (KR) .................. 10-2015-0045680
Jul. 10, 2015  (KR) .................. 10-2015-0098647

(51) Int. Cl.
*H01L 27/11582*   (2017.01)
*H01L 27/11565*   (2017.01)

(52) U.S. Cl.
CPC .. *H01L 27/11582* (2013.01); *H01L 27/11565* (2013.01)

(58) Field of Classification Search
CPC ................. H01L 27/11582; H01L 27/11565
See application file for complete search history.

(56) References Cited

U.S. PATENT DOCUMENTS

2014/0169105 A1* 6/2014 Oh ..................... H01L 29/7926
                                              365/185.29

FOREIGN PATENT DOCUMENTS

KR   10-2013-0007703 A   1/2013

* cited by examiner

*Primary Examiner* — Marc Armand
(74) *Attorney, Agent, or Firm* — Myers Bigel, P.A.

(57) ABSTRACT

Semiconductor memory devices and methods for manufacturing the same are provided. The device may include vertical channel structures that are two-dimensionally arranged on a substrate and vertically extend from the substrate. The device may also include bit lines on the vertical channel structures, and each of the bit lines may be commonly connected to the vertical channel structures arranged in a first direction. The device may further include common source lines that extend between the vertical channel structures in a second direction intersecting the first direction and a source strapping line that is disposed at the same vertical level as the bit lines and electrically connects the common source lines to each other.

20 Claims, 24 Drawing Sheets

SEMICONDUCTOR MEMORY DEVICES AND METHODS FOR MANUFACTURING THE SAME

CROSS-REFERENCE TO RELATED APPLICATIONS

This U.S. non-provisional patent application claims priority under 35 U.S.C. § 119 to Korean Patent Application No. 10-2015-0045680 filed on Mar. 31, 2015 and Korean Patent Application No. 10-2015-0098647 filed on Jul. 10, 2015 in the Korean Intellectual Property Office, the disclosures of all of which are hereby incorporated by reference in their entireties.

BACKGROUND

The inventive concepts relate to semiconductor memory devices and methods for manufacturing the same and, more particularly, to three-dimensional (3D) semiconductor memory devices and methods for manufacturing the same.

Semiconductor devices have been highly integrated to provide excellent performance and to be manufactured with low costs. The integration density of semiconductor memory devices may directly affect manufacturing costs of the semiconductor memory devices. An integration degree of a conventional two-dimensional (2D) memory device may be mainly determined by an area where a unit memory cell occupies. Thus, the integration density of the conventional 2D memory device may be greatly affected by a technique of forming fine patterns. However, since extremely high-priced apparatuses may be used to form fine patterns, the integration density of 2D memory devices may be limited.

Three-dimensional (3D) memory devices including three-dimensionally arranged memory cells have been developed to overcome the limitations of 2D devices. However, new process technologies capable of reducing manufacture costs and improving reliability may be demanded to mass-produce the 3D memory devices.

SUMMARY

Embodiments of the inventive concepts may provide semiconductor memory devices having high density.

Embodiments of the inventive concepts may also provide methods for manufacturing the semiconductor memory device having high density.

A semiconductor memory device may include a plurality of vertical channel structures that are two-dimensionally arranged on a substrate. The plurality of vertical channel structures may vertically extend from the substrate. The device may also include a plurality of bit lines on the plurality of vertical channel structures and a plurality of common source lines between the plurality of vertical channel structures. Each of the plurality of bit lines may be commonly connected to ones of the plurality of vertical channel structures arranged in a first direction, and each of the plurality of common source lines may extend in a second direction intersecting the first direction. The device may further include a source strapping line electrically connected to the plurality of common source lines. A lower surface of the source strapping line and lower surfaces of the plurality bit lines may be at an equal level.

According to various embodiments, a width of the source strapping line in the second direction may be greater than a width of each of the plurality of bit lines in the second direction.

In various embodiments, the device may further include a plurality of contacts. Each of the plurality of contacts may overlap one of the plurality of common source lines in plan view. Ones of the plurality of contacts may electrically connect respective ones of the plurality of vertical channel structures to respective ones of the plurality of bit lines, and at least two of the plurality of contacts may overlap both the source strapping line and one of the plurality of common source lines.

According to various embodiments, the device may additionally include a plurality of source studs. Each of the plurality of source studs may be connected to a top surface of one of the plurality of common source lines and may be connected to the at least two of the plurality of contacts that overlap the source strapping line and the one of the plurality of common source lines.

According to various embodiments, the device may additionally include a plurality of conductive lines. Each of the plurality of conductive lines may be connected to a bottom surface of one of the plurality of contacts, and each of the plurality of conductive lines may intersect one of the plurality of common source lines and may extend on the plurality of vertical channel structures.

In various embodiments, the device may also include a plurality of channel studs. Each of the plurality of channel studs may connect a top end of one of the plurality of vertical channel structures to one of the plurality of conductive lines.

According to various embodiments, ones of the plurality of conductive lines intersecting one of the plurality of common source lines may have asymmetrical lengths with respect to the one of the plurality of common source lines.

In various embodiments, the plurality of conductive lines may extend in the first direction, and each of the plurality of conductive lines may include an offset portion that overlaps one of the plurality of common source lines in plan view and is offset from the first direction toward the second direction.

In various embodiments, the plurality of common source lines may include a first common source line and a second common source line adjacent to the first common source line. The plurality of conductive lines may extend in the first direction and may include a first conductive line intersecting the first common source line and a second conductive line intersecting the second common source line. The first conductive line may include a first offset portion that is offset from the first direction toward the second direction and overlaps the first common source line in plan view, and the second conductive line may include a second offset portion that is offset from the first direction toward a third direction that is opposite to the second direction and overlaps the second common source line in plan view.

In various embodiments, the plurality of common source lines may include a first common source line and a second common source line adjacent to the first common source line. The plurality of bit lines may include odd-numbered bit lines and even-numbered bit lines arranged in the second direction in an alternating sequence. Each of the odd-numbered bit lines is connected to one of the plurality of contacts that overlaps the first common source line in plan view, and each of the even-numbered bit lines is connected to one of the contacts that overlaps the second common source line in plan view.

According to various embodiments, each of the plurality of common source lines may have a plate shape that extends between the plurality of vertical channel structures and extends perpendicular to a top surface of the substrate.

A semiconductor memory device may include an electrode structure on a substrate, a plurality of vertical channel structures extending through the electrode structure and being connected to the substrate and first and second common source lines at respective opposing sides of the electrode structure. The electrode structure may include a plurality of electrodes vertically stacked on the substrate, and the first and second common source lines may extend in a first direction. The device may also include a plurality of contacts on the first and second common source lines, and the plurality of contacts may be arranged in the first direction. The device may further include a plurality of bit lines extending in a second direction that intersects the first direction and a source strapping line electrically connecting the first and second common source lines to each other. Each of the plurality of bit lines may be electrically connected to one of the plurality of vertical channel structures. Each of the first and second common source lines may be connected to the source strapping line through at least two of the plurality of contacts interposed therebetween.

According to various embodiments, a number of first ones of the plurality of contacts connecting the first common source line to the source strapping line may be different from a number of second ones of the plurality of contacts connecting the second common source line to the source strapping line.

In various embodiments, the device may also include a plurality of conductive lines on the plurality of vertical channel structures and the first and second common source lines. Each of the first and second common source lines may be connected to the source strapping line through at least two of the plurality of conductive lines.

According to various embodiments, the plurality of bit lines may include odd-numbered bit lines and even-numbered bit lines arranged in the first direction in an alternating sequence. Each of the odd-numbered bit lines may be connected to one of the plurality of contacts overlapping the first common source line in plan view, and each of the even-numbered bit lines may be connected to one of the contacts overlapping the second common source line in plan view.

In various embodiments, the at least two of the plurality of contacts may overlap the source strapping line and one of the first and second common source lines.

According to various embodiments, the device may further include a source stud between the first and second common source lines and the plurality of conductive lines. The source stud may be connected to ones of the plurality of the conductive lines that overlap the source strapping line in plan view.

In various embodiments, the substrate may include a cell array region and a peripheral circuit region, the source strapping line may be one of a plurality of source strapping lines, and ones of the plurality of source strapping lines may be in the cell array region.

According to various embodiments, a lower surface of the source strapping line and lower surfaces of the plurality of bit lines may be disposed at an equal level.

In various embodiments, the device may also include a plurality of conductive lines on the plurality of vertical channel structures and the first and second common source lines. The plurality of conductive lines may extend in the second direction, and each of the plurality of conductive lines may have an offset portion that is offset from the second direction and overlaps one of the first and second common source lines.

A semiconductor device may include first and second common source lines on a substrate, and the first and second common source lines may extend in a first direction. The device may also include an electrode structure between the first and second common source lines on the substrate, and the electrode structure may include a plurality of electrodes vertically staked on the substrate. The device may further include a plurality of vertical channel structures extending through the electrode structure and a plurality of bit lines crossing over the first and second common source lines and the electrode structure. A respective one of the plurality of bit lines may be electrically connected to a respective one of the plurality of vertical channel structures. The device may additionally include a source strapping line crossing over the first and second common source lines and the electrode structure. The source strapping line may be electrically connected to the first and second common source lines, and a lowermost surface of the source strapping line may be coplanar with lowermost surfaces of the plurality of bit lines.

According to various embodiments, the plurality of bit lines and the source strapping line may include a same material.

In various embodiments, the plurality of bit lines and the source strapping line may extend parallel to each other, and each of the plurality of bit lines and the source strapping line may have a linear shape.

According to various embodiments, the source strapping line may be between first ones of the plurality of bit lines and second ones of the plurality of bit lines.

In various embodiments, a width of the source strapping line in the first direction may be greater than a width of each of the plurality of bit lines in the first direction.

According to various embodiments, the device may also include a plurality of conductive lines extending in a second direction crossing the first direction. A respective one of the plurality of conductive lines may electrically connect a respective one of the plurality of bit lines to a respective one of the plurality of vertical channel structures. The plurality of conductive lines may include first ones of the plurality of conductive lines that cross over the first common source line and second ones of the plurality of conductive lines that cross over the second common source line. Each of the first ones of the plurality of conductive lines may include a first offset portion that overlaps the first common source line in plan view and is offset from the second direction toward the first direction, and each of the second ones of the plurality of conductive lines may include a second offset portion that overlaps the second common source line in plan view and is offset from the second direction toward a third direction that is opposite the first direction.

In various embodiments, the plurality of bit lines may include first ones of the plurality of bit lines and second ones of plurality of bit lines arranged in the first direction in an alternating sequence, and a respective one of the first ones of the plurality of bit lines may be electrically connected to a respective one of the first ones of the plurality of conductive lines, and a respective one of the second ones of the plurality of bit lines may be electrically connected to a respective one of the second ones of the plurality of conductive lines.

According to various embodiments, the device may also include a plurality of conductive contacts that may include first ones of the plurality of conductive contacts overlapping the first common source line in plan view and second ones of the plurality of conductive contacts overlapping the second common source line in plan view. The plurality of bit lines may include first ones of the plurality of bit lines and second ones of plurality of bit lines arranged in the first direction in an alternating sequence. A respective one of the first ones of the plurality of bit lines may contact a respective one of the first ones of the plurality of conductive contacts, and a respective one of the second ones of the plurality of bit lines may contact a respective one of the second ones of the plurality of conductive contacts.

BRIEF DESCRIPTION OF THE DRAWINGS

The inventive concepts will become more apparent in view of the attached drawings and accompanying detailed description.

DETAILED DESCRIPTION

Figure 1:
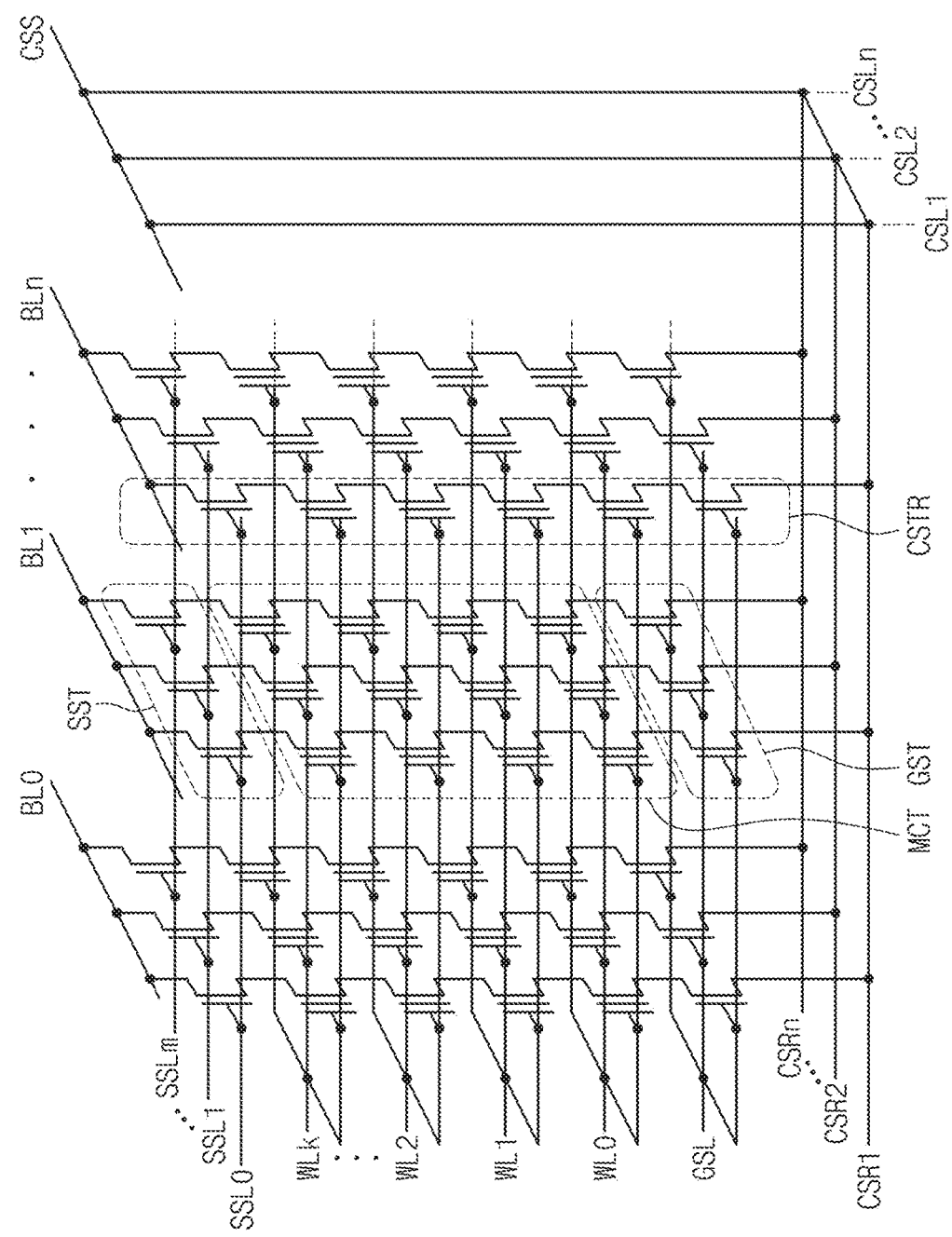
FIG. 1 is a circuit diagram illustrating a semiconductor memory device according to example embodiments of the inventive concepts.

The inventive concepts will now be described more fully hereinafter with reference to the accompanying drawings, in which example embodiments of the inventive concepts are shown. The advantages and features of the inventive concepts and methods of achieving them will be apparent from the following example embodiments that will be described in more detail with reference to the accompanying drawings. It should be noted, however, that the inventive concepts are not limited to the following example embodiments and may be implemented in various forms. Accordingly, these example embodiments are provided so that this disclosure will be thorough and complete and will convey the scope of the disclosure to those skilled in the art. In the drawings, the sizes and relative sizes of layers and regions exaggerated for clarity. Like reference numbers refer to like elements throughout.

It will be understood that when an element such as a layer (e.g., a conductive layer, a semiconductor layer or an insulating layer), region or substrate is referred to as being "on" another element, it can be directly on the other element or intervening elements may be present. It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present inventive concepts.

The terminology used herein is for the purpose of describing particular embodiments only and is not intended to limit the inventive concepts. As used herein, the singular terms "a," "an" and "the" are intended to include the plural forms as well, unless the context clearly indicates otherwise. As used herein, the term "and/or" includes any and all combinations of one or more of the associated listed items. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Example embodiment will be described with cross-sectional views and/or plan views that are schematic illustrations of idealized embodiments and intermediate structures of example embodiments. Accordingly, shapes of the exemplary views may be modified according to manufacturing techniques and/or allowable errors. As such, variations from the shapes of the illustrations as a result, for example, of manufacturing techniques and/or tolerances, are to be expected. Thus, example embodiments of the inventive concepts should not be construed as limited to the particular shapes illustrated herein but may include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place.

FIG. 1 is a circuit diagram illustrating a semiconductor memory device according to example embodiments of the inventive concepts.

Referring to FIG. 1, a semiconductor memory device according to example embodiments may include a plurality of common source regions CSR1 to CSRn, a plurality of bit lines BL0 to BLn, and a plurality of cell strings CSTR disposed between the common source regions CSR1 to CSRn and the bit lines BL0 to BLn.

The common source regions CSR1 to CSRn may be conductive patterns formed on a semiconductor substrate or dopant regions formed in the semiconductor substrate. The bit lines BL0 to BLn may be conductive patterns (e.g., metal lines) which are spaced apart from each other and are disposed over the semiconductor substrate. A plurality of the cell strings CSTR may be connected in parallel to one of the bit lines BL0 to BLn, and thus the cell strings CSTR may be two-dimensionally arranged on the semiconductor substrate.

Each of the cell strings CSTR may include a ground selection transistor GST connected to one of common source regions CSR1 to CSRn, a string selection transistor SST connected to one of the bit lines BL0 to BLn, and a plurality of memory cell transistors MCT disposed between the ground and string selection transistors GST and SST. The ground selection transistor GST, the memory cell transistors MCT, and the string selection transistor SST may be connected in series to each other. In addition, a ground selection line GSL, a plurality of word lines WL0 to WLk and string selection lines SSL0 to SSLm, which are disposed between the common source regions CSR1 to CSRn and the bit lines BL0 to BLn, may be used as gate electrodes of the ground selection transistor GST, the memory cell transistors MCT and the string selection transistors SST, respectively.

The ground selection transistors GST may be disposed at the substantially same level from the substrate, and gate electrodes of the ground selection transistors GST may be connected in common to the ground selection line GSL, thereby being in an equipotential state. To achieve this, the ground selection line GSL may be a plate-shaped or comb-shaped conductive pattern disposed between the common source regions CSR1 to CSRn and the memory cell transistors MCT nearest thereto. Gate electrodes of the memory cell transistors MCT disposed at the substantially same level from the common source regions CSR1 to CSRn may also be connected in common to one of the word lines WL0 to WLk, thereby being in an equipotential state. To achieve this, each of the word lines WL0 to WLk may be a flat plate-shaped or comb-shaped conductive pattern. Since one cell string CSTR includes the plurality of memory cell transistors MCT disposed at different levels from each other from the common source regions CSR1 to CSRn, the word lines WL0 to WLk may be sequentially stacked between the common source regions CSR1 to CSRn and the bit lines BL0 to BLn.

Each of the cell strings CSTR may include a semiconductor pillar that vertically extends from one of the common source regions CSR1 to CSRn so as to be connected to one of the bit lines BL0 to BLn. The semiconductor pillars may be formed to penetrate the ground selection line GSL and the word lines WL0 to WLk. In addition, the semiconductor pillar may include a body portion and one or more dopant regions formed in one or both end portions of the body portion. For example, a drain region may be formed in a top end portion of the semiconductor pillar.

A data storage layer may be disposed between the semiconductor pillar and the word lines WL0 to WLk. According to some embodiments, the data storage layer may include a charge storage layer. For example, the data storage layer may include a trap insulating layer, a floating gate electrode, or an insulating layer including conductive nano dots.

A dielectric layer used as a gate insulating layer of the ground selection transistor GST or string selection transistor SST may be disposed between the semiconductor pillar and the ground selection line GSL or between the semiconductor pillar and one of the string selection lines SSL0 to SSLm. The gate insulating layer of at least one of the ground and string selection transistors GST and SST may be formed of the same material as the data storage layer of the memory cell transistor MCT or may be formed of an insulating material (e.g., a silicon oxide layer) used as a gate insulating layer of a metal-oxide-semiconductor field effect transistor (MOSFET).

The ground selection transistor GST, the string selection transistor SST and the memory cell transistors MCT may be MOSFETs using the semiconductor pillar as channel regions. In some embodiments, the semiconductor pillar, the ground selection transistor GST, the string selection transistor SST and the memory cell transistors MCT may constitute MOS capacitors. In this case, the ground selection transistor GST, the memory cell transistors MCT and the string selection transistor SST may share inversion regions, which are formed by fringe fields generated from the ground selection line GSL, the word lines WL0 to WLk and the string selection lines SSL0 to SSLm, so as to be electrically connected to each other.

The common source regions CSR1 to CSRn may be electrically connected to a source strapping line CSS through common source lines CSL1 to CSLn. In other words, the common source regions CSR1 to CSRn may be connected in common to the source strapping line CSS, thereby being in an equipotential state. In some embodiments, a ground voltage may be applied to the common source regions CSR1 to CSRn through the source strapping line CSS during a read operation or a program operation of the semiconductor memory device. Hereinafter, a structure of the semiconductor memory device including the source strapping line CSS will be described in more detail.

Figure 2:
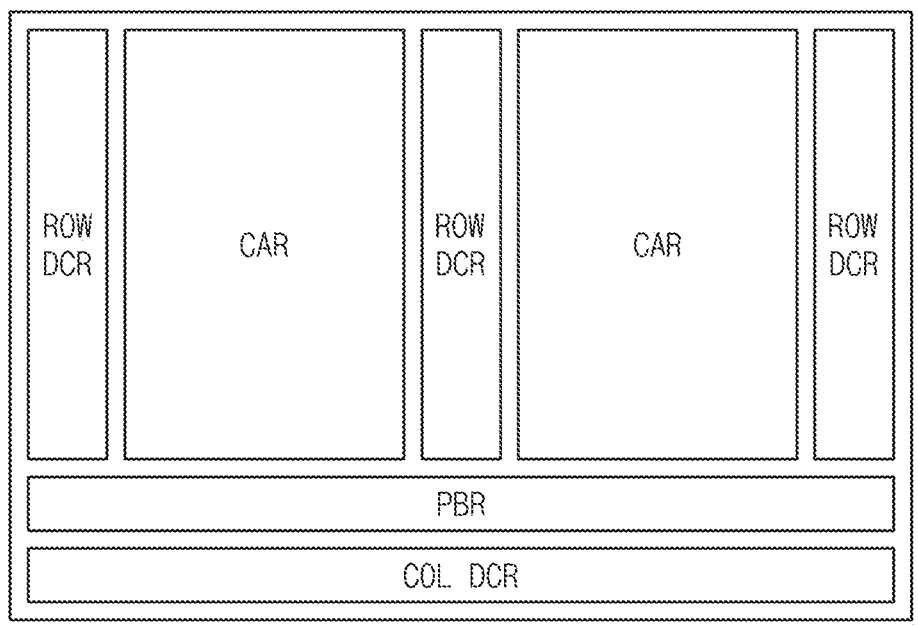
FIG. 2 is a conceptual diagram schematically illustrating components of a semiconductor memory device according to example embodiments of the inventive concepts.

FIG. 2 is a conceptual diagram schematically illustrating components of a semiconductor memory device according to example embodiments of the inventive concepts. Referring to FIG. 2, the semiconductor memory device may include a cell array region CAR and a peripheral circuit region. The peripheral circuit region may include row decoder regions ROW DCR, a page buffer region PBR, and a column decoder region COL DCR. A memory cell array including a plurality of memory cells may be disposed in the cell array region CAR. The memory cell array may further include a plurality of word lines and a plurality of bit lines, which are electrically connected to the memory cells. In some embodiments, the memory cell array may include a plurality of memory blocks of which each corresponds to a data erasing unit.

A row decoder that selects the word lines of the memory cell array may be disposed in the row decoder region ROW DCR. The row decoder may select one of the memory blocks of the memory cell array and one of the word lines of the selected memory block in response to an address signal. The row decoder may provide a first word line voltage and second word line voltages generated from a voltage generation circuit (not shown) into the selected word line and unselected word lines, respectively, in response to a control signal of a control circuit (not shown).

A page buffer that senses data stored in the memory cells may be disposed in the page buffer region PBR. Depending on an operation mode, the page buffer may temporarily store data to be stored in the memory cells or may sense data stored in the memory cells. The page buffer may function as a write driver in a program operation mode and may function as a sense amplifier in a read operation mode.

A column decoder that is connected to the bit lines of the memory cell array may be disposed in the column decoder region COL DCR. The column decoder may provide data-transmission paths between the page buffer and an external device (e.g., a memory controller).

Figure 3:
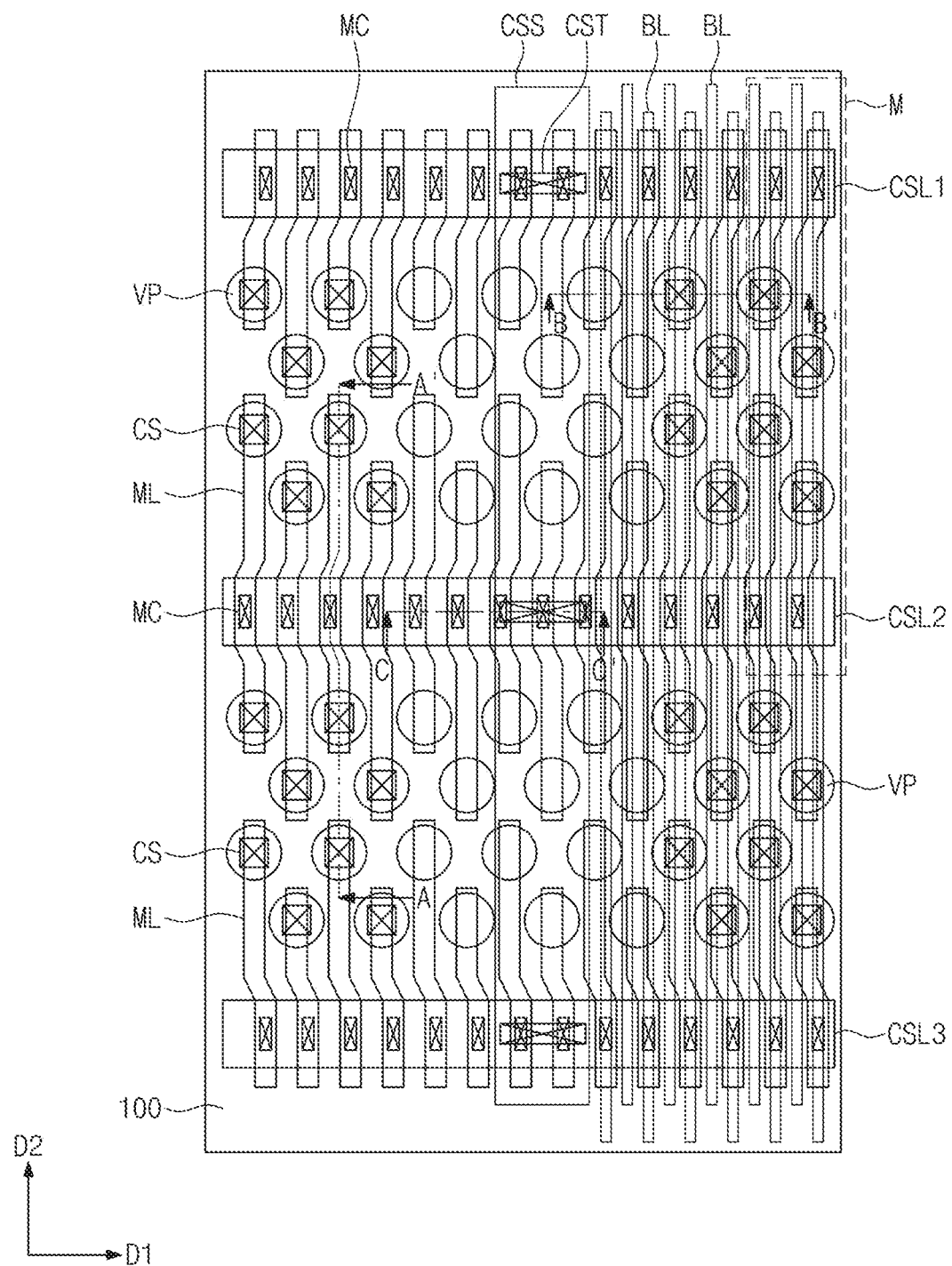
FIG. 3 is a plan view illustrating a cell array region of a semiconductor memory device according to example embodiments of the inventive concepts.
Figure 4A:
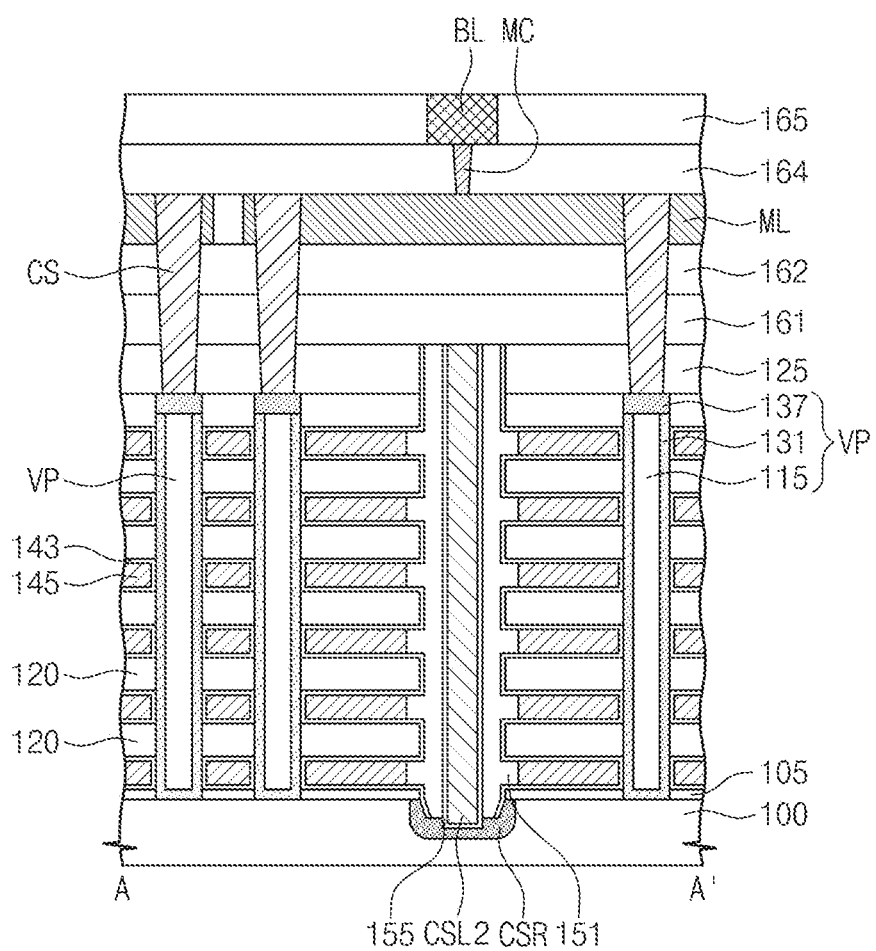
FIG. 4A is a cross-sectional view taken along the line A-A' of FIG. 3.
Figure 4B:
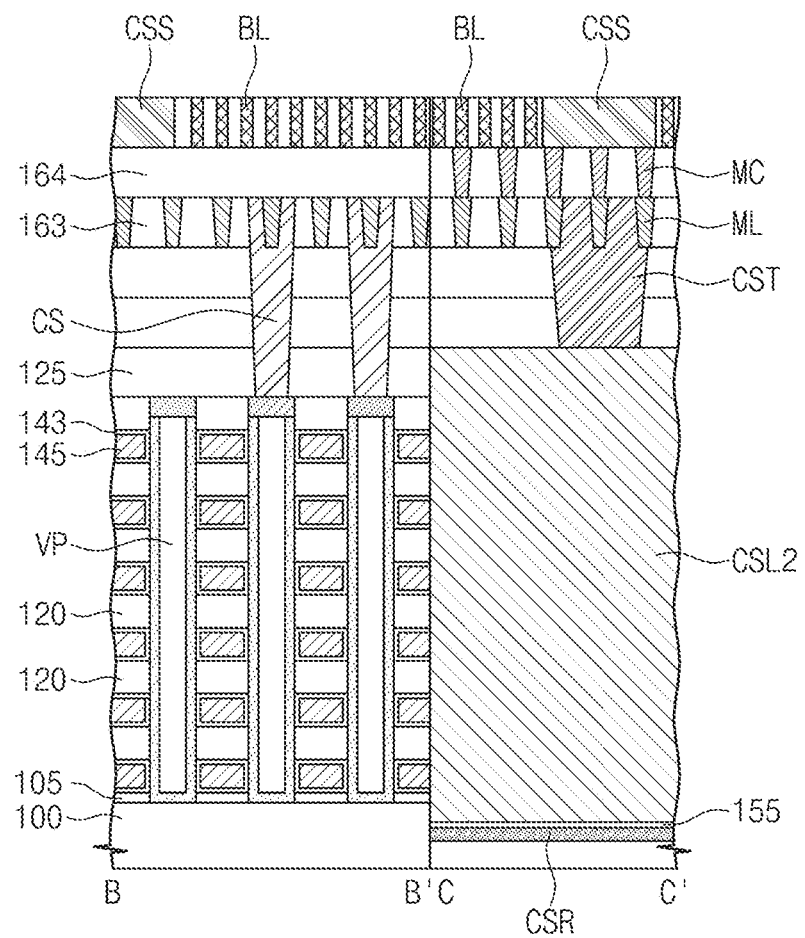
FIG. 4B illustrates cross-sectional views taken along the lines B-B' and C-C' of FIG. 3.
Figure 4C:
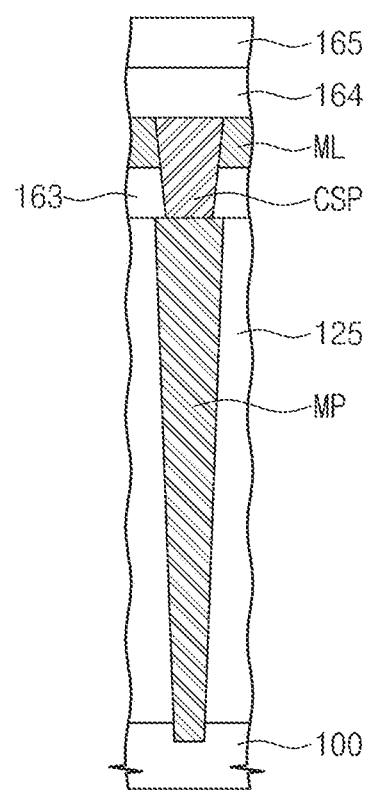
FIG. 4C is a cross-sectional view illustrating a peripheral circuit region of a semiconductor memory device according to example embodiments of the inventive concepts.
Figure 5:
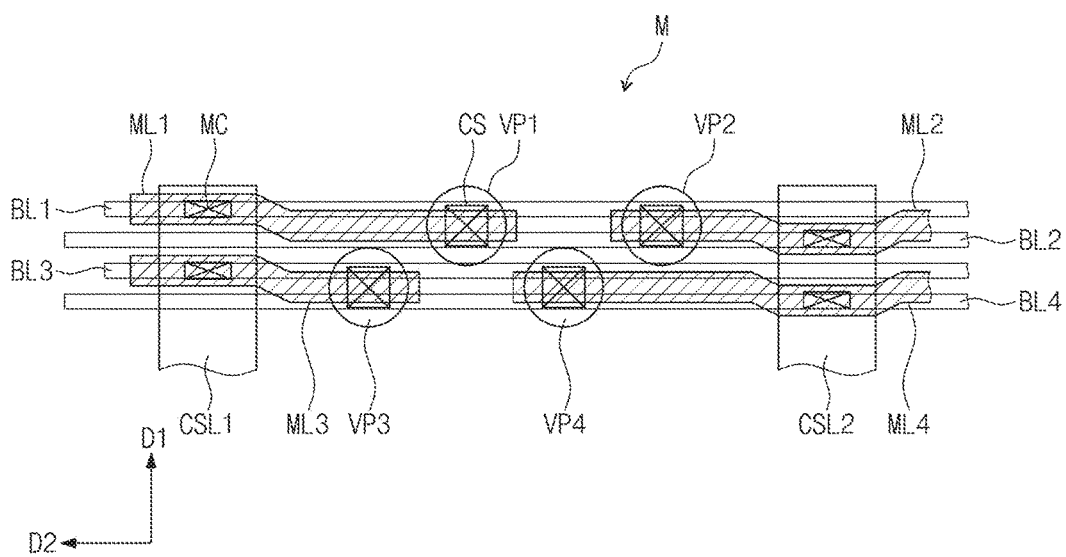
FIG. 5 is an enlarged view of the region M of FIG. 3.

FIG. 3 is a plan view illustrating a cell array region of a semiconductor memory device according to example embodiments of the inventive concepts. FIG. 4A is a cross-sectional view taken along the line A-A' of FIG. 3. FIG. 4B illustrates cross-sectional views taken along the lines B-B' and C-C' of FIG. 3. FIG. 4C is a cross-sectional view illustrating a peripheral circuit region of a semiconductor memory device according to example embodiments of the inventive concepts. FIG. 5 is an enlarged view of the region 'M' of FIG. 3.

Referring to FIGS. 3, 4A, 4B, 4C, and 5, an electrode structure may be provided on a substrate 100. The substrate 100 may be a silicon substrate, a germanium substrate, or a silicon-germanium substrate. The electrode structure may include first insulating layers 120 and a plurality of electrode layers 145 vertically spaced apart from each other by the first insulating layers 120. The electrode structure may be defined by common source lines to be described below, and a plurality of the electrode structures may be provided on the substrate 100. The lowermost one of the electrode layers 145 may correspond to a lower selection gate pattern, and the uppermost one of the electrode layers 145 may correspond to an upper selection gate pattern. In some embodiment, the lower selection gate pattern may be a ground selection line, and the upper selection gate pattern may be a string selection line. The electrode layers 145 between the upper and lower selection gate patterns may be cell gate patterns. A buffer insulating layer 105 may be provided between the substrate 100 and the lower selection gate pattern and may be in contact with the substrate 100. For example, the buffer insulating layer 150 may include a silicon oxide layer. The electrode layers 145 may have the same thickness as illustrated in FIGS. 4A and 4B. In some embodiments, ones of the electrode layers 145 may have thicknesses different from others. For example, the lower selection gate pattern and the upper selection gate pattern may be thicker than the cell gate patterns. The electrode layers 145 may include, for example, doped silicon, a metal, a metal silicide and/or a conductive metal nitride.

In FIGS. 4A and 4B, six electrode layers 145 and six first insulating layers 120 are illustrated for the purpose of ease and convenience in explanation and illustration. In some embodiments, the number of the electrode layers 145 and the number of the first insulating layers 120 may be seven or more or five or less. In addition, at least one of the upper and lower selection gate patterns may be provided in plurality in the electrode structure.

Vertical channel structures VP may penetrate (e.g., extends through) the electrode structure and may be connected to the substrate 100. The vertical channel structures VP may be two-dimensionally arranged on the substrate 100. It will be understood that "elements two-dimensionally arranged" refers to elements arranged along first and second directions perpendicular to each other to constitute a plurality of rows and a plurality of columns when viewed from a plan view. Referring again to FIG. 3, the vertical channel structures VP may form a plurality of lines (e.g., rows) extending in a first direction D1 that extends parallel to a top surface of the substrate 100. Ones of the vertical channel structures VP included in two immediately adjacent rows may be numbered with consecutive integers along the first direction D1, and odd-numbered vertical channel structures VP may be offset from even-numbered vertical channel structures VP toward a second direction D2 intersecting the first direction D1 as illustrated in FIG. 3. In other words, ones of the vertical channel structures VP included in two immediately adjacent rows may be arranged in a zigzag pattern along the first direction D1 as illustrated in FIG. 3. Distances from the odd-numbered vertical channel structures VP to a common source line adjacent thereto, which will be described below, may be different from distances from the even-numbered vertical channel structures VP to the adjacent common source line. It will be understood that two immediately adjacent rows of the vertical channel structures VP refers to two rows of the vertical channel structures VP between which no intervening rows of the vertical channel structures VP is disposed.

Still referring to FIGS. 4A and 4B, each of the vertical channel structures VP may include a semiconductor pattern 131 conformally disposed along a sidewall and a bottom surface of a through hole penetrating the electrode structure, a filling insulation pattern 115 of which a sidewall and a bottom surface are surrounded by the semiconductor pattern 131, and a pad pattern 137 provided on the semiconductor pattern 131 to fill a top end portion of the through hole. The semiconductor pattern 131 may be formed of a single-layer or multi-layer including, for example, at least one of silicon, geranium, or silicon-germanium. The filling insulation pattern 115 may include, for example, at least one of a silicon oxide layer, a silicon nitride layer, or a silicon oxynitride layer. The pad pattern 137 may include, for example, at least one of a doped semiconductor, a metal, a metal silicide, or a metal nitride.

A data storage layer 143 may be provided between the semiconductor pattern 131 and each of the electrode layers 145. The data storage layer 143 may cover top and bottom surfaces of each of the electrode layers 145 as well as a sidewall of each of the electrode layers 145 as illustrated in FIGS. 4A and 4B. However, the inventive concepts are not limited thereto. In some embodiments, the data storage layer 143 may vertically extend along a sidewall of the semiconductor pattern 131. In some embodiments, one or some of layers constituting the data storage layer 143 may extend along the top and bottom surfaces of each of the electrode layers 145 as illustrated in FIGS. 4A and 4B, and the rest of the layers constituting the data storage layer 143 may vertically extend along the sidewall of the semiconductor pattern 131.

The data storage layer 143 may include a blocking insulating layer, a charge storage layer, and a tunnel insulating layer which are sequentially stacked on the sidewall of each of the electrode layers 145. The blocking insulating layer may include a high-k dielectric layer such as an aluminum oxide layer and/or a hafnium oxide layer. In some embodiments, the blocking insulating layer may be a multi-layer including a plurality of thin layers. In this case, one or some of the thin layers of the blocking insulating layer may extend along the top and bottom surfaces of each of the electrode layers 145, and the rest of the thin layers of the blocking insulating layer may vertically extend along the sidewall of the semiconductor pattern 131. The charge storage layer may include at least one of a charge trapping layer or an insulating layer including conductive nano particles. For example, the charge trapping layer may include a silicon nitride layer. The tunnel insulating layer may include, for example, a silicon oxide layer.

Common source lines CSL1 to CSL3 may be provided on the substrate 100 and may be connected to the substrate 100. The plurality of electrode structures may be provided on the substrate 100. The common source lines CSL1 to CSL3 may define each of the plurality of electrode structures. In other words, one of the plurality of electrode structures may be disposed between two immediately adjacent ones of the common source lines CSL1 to CSL3. It will be understood that CSL1 is immediately adjacent to CSL2 since there is no intervening common source lines, and CSL1 is not immediately adjacent to CSL3 since there is CSL2 between CSL1 and CSL3. The electrode structures and the common source lines CSL1 to CSL3 may be alternately arranged along the second direction D2 when viewed from a plan view as illustrated in FIG. 3. In some embodiments, the common source lines CSL1 to CSL3 may have linear shapes (e.g., line shapes) extending along common source regions CSR formed in an upper portion of the substrate 100 when viewed from a plan view. In this case, each of the common source lines CSL1 to CSL3 may have a plate shape that extends perpendicular to the top surface of the substrate 100. In some embodiments, the common source lines CSL1 to CSL3 may have pillar shapes. In this case, an additional interconnection may be provided to connect the common source lines, which have the pillar shapes and are arranged along the first direction D1, to each other.

The common source regions CSR may be regions doped with dopants having a different conductivity type from the substrate 100. The common source regions CSR and the common source lines CSL1 to CSL3 may extend in the first direction D1. Arrangement and the number of the vertical channel structures VP disposed between two immediately adjacent ones of the common source lines CSL1 to CSL3 are not limited to those illustrated in FIG. 3 but may vary.

The common source lines CSL1 to CSL3 may be electrically insulated from the electrode layers 145 by spacer insulating layers 151. A barrier layer 155 may be provided between each of the spacer insulating layers 151 and each of the common source lines CSL1 to CSL3. The barrier layer 155 may extend on a bottom surface of each of the common source lines CSL1 to CSL3.

In some embodiment, the common source lines CSL1 to CSL3 may include tungsten. However, the inventive concepts are not limited thereto. In some embodiments, the common source lines CSL1 to CSL3 may include at least one of conductive materials such as metals (e.g., copper, titanium and aluminum), a doped semiconductor, and a conductive metal nitride. For example, the barrier layer 155 may include a metal (e.g., titanium or tantalum) and/or a metal nitride (e.g., titanium nitride or tantalum nitride). For example, the spacer insulating layer 151 may include at least one of a silicon oxide layer, a silicon nitride layer, or a silicon oxynitride layer.

Top surfaces of the common source lines CSL1 to CSL3 may be higher than top surfaces of the vertical channel structures VP. In some embodiments, a first interlayer insulating layer 125 may be provided to cover the vertical channel structures VP, and the common source lines CSL1 to CSL3 may penetrate the first interlayer insulating layer 125. The top surfaces of the common source lines CSL1 to CSL3 may be exposed by the first interlayer insulating layer 125.

Conductive lines ML may be provided to extend from above the vertical channel structures VP to above the common source lines CSL1 to CSL3. The conductive lines ML may be electrically connected to the vertical channel structures VP through channel studs CS. As illustrated in FIGS. 3 and 4B, the channel studs CS may not be provided on some of the vertical channel structures VP. The vertical channel structures VP not connected to the channel studs CS may be portions of dummy cells.

Extending lengths of the conductive lines ML from the common source lines CSL1 to CSL3 may be varied depending on positions of the vertical channel structures VP connected to the conductive lines ML. In some embodiments, in the case that the odd-numbered vertical channel structures VP and the even-numbered vertical channel structures VP included in two immediately adjacent rows are arranged in a zigzag pattern as described above, the arrangement of the conductive lines ML extending to above the odd-numbered vertical channel structures VP may be different from that of the conductive lines ML extending to above the even-numbered vertical channel structures VP. For example, the conductive line ML connected to the odd-numbered vertical channel structure VP may include a first portion disposed at a first side of a second common source line CSL2 and a second portion disposed at a second side of the second common source line CSL2 that is opposite the first side when viewed from a plan view, and the first portion may be longer than the second portion. The conductive line ML connected to the even-numbered vertical channel structure VP may include a third portion disposed at the first side of the second common source line CSL2 and a fourth portion disposed at the second side of the second common source line CSL2 when viewed from a plan view, and the fourth portion may be longer than the third portion. In other words, the conductive lines ML may have asymmetric lengths with respect to each of the common source lines CSL1 to CSL3 as illustrated in FIG. 3.

The conductive lines ML may extend in the second direction D2. Each of the conductive lines ML may include an offset portion that is offset from the second direction D2 and overlaps one of the common source lines CSL1 to CSL3 when viewed from a plan view. The offset portion of the each of the conductive lines ML may be offset relative to a remaining portion of the each of the conductive lines ML. In other words, each of the conductive lines ML may include the offset portion having a central axis that is offset from a main central axis in which the conductive lines ML extend when viewed from a plan view. For example, the conductive lines ML overlapping with a first common source line CSL1 may have offset portions that are offset from the second direction toward the first direction D1 on the first common source line CSL1, and the conductive lines ML overlapping with the second common source line CSL2 may have offset portions that are offset from the second direction toward a direction opposite the first direction D1 on the second common source line CSL2 as illustrated in FIG. 3. In other words, the conductive lines ML overlapping with a first common source line CSL1 may have offset portions that are offset in or along the first direction D1 relative to remaining portions thereof on the first common source line CSL1, and the conductive lines ML overlapping with the second common source line CSL2 may have offset portions that are offset in or along a direction opposite the first direction D1 relative to remaining portions thereof on the second common source line CSL2. The first and second common source lines CSL1 and CSL2 may be immediately adjacent to each other. These shapes of the conductive lines ML may be provided to easily connect the vertical channel structures VP adjacent to each other in the second direction D2 to different bit lines to be described below, respectively. In FIGS. 4A and 4B, an interface exists between the conductive lines ML and the channel studs CS connected to each other. However, the inventive concepts are not limited thereto. In some embodiments, the conductive lines ML and the channel studs CS may be formed at the same time by a dual damascene process, so interfaces between the conductive lines ML and the channel studs CS may not exist or may not visible.

The conductive lines ML may extend into a peripheral circuit region, as illustrated in FIG. 4C. The peripheral circuit region illustrated in FIG. 4C may be one of the row decoder region ROW DCR, the page buffer region PBR, and the column decoder region COL DCR of FIG. 2. The conductive lines ML disposed in the peripheral circuit region may be connected to the substrate 100 through peripheral contacts CSP and MP. For example, the peripheral contacts CSP and MP may be connected to source/drain regions of transistors disposed on the substrate 100 of the peripheral circuit region.

Bit lines BL extending in the second direction D2 may be provided on the vertical channel structures VP. The bit lines BL disposed at a right side of a source strapping line CSS to be described below are illustrated in FIG. 3 for the purpose of illustrating the structure of the semiconductor memory device. However, bit lines BL may also be provided a left side of the source strapping line CSS so as to be arranged in the same manner as the bit lines BL illustrated in FIG. 3. Contacts MC may be provided between the bit lines BL and the conductive lines ML. Thus, the vertical channel structures VP may be electrically connected to the bit lines BL through the channel studs CS, the conductive lines ML, and the contacts MC. The contacts MC may be disposed above the common source lines CSL1 to CSL3 so as to be arranged along the extending direction of the common source lines CSL1 to CSL3. In other words, each of the contacts MC may overlap with one of the common source lines CSL1 to CSL3.

Two bit lines BL that are immediately adjacent each other (e.g., BL1 and BL2) may be connected to two contacts MC that are on different common source lines CSL1 to CSL3 as illustrated in FIG. 5. As illustrated in FIG. 5, odd-numbered bit lines BL1 and BL3 may be connected to the contacts MC on the first common source line CSL1, and even-numbered bit lines BL2 and BL4 may be connected to the contacts MC on the second common source line CSL2. The odd-numbered bit lines (e.g., BL1 and BL3) and the even-numbered bit lines (e.g., BL2 and BL4) may be arranged in the first direction D1 in an alternating sequence. As described above, the bit lines BL may be easily connected to the adjacent channel structures VP, respectively, due to the conductive lines ML which have the offset portions that are offset toward the opposite directions on the first and second common source lines CSL1 and CSL2, respectively. For example, as illustrated in FIG. 5, a first vertical channel structure VP1 may be electrically connected to a first bit line BL1 through the channel stud CS, a first conductive line ML1 and the contact MC on the first common source line CSL1, and a second vertical channel structure VP2 spaced apart from the first vertical channel structure VP1 in the second direction D2 may be electrically connected to a second bit line BL2 that is immediately adjacent to the first bit line BL1 through the channel stud CS, a second conductive line ML2 and the contact MC on the second common source line CSL2. Likewise, a third vertical channel structure VP3 may be electrically connected to a third bit line BL3 through the channel stud CS, a third conductive line ML3 and the contact MC on the first common source line CSL1, and a fourth vertical channel structure VP4 spaced apart from the third vertical channel structure VP3 in the second direction D2 may be electrically connected to a fourth bit line BL4 that is immediately adjacent to the third bit line BL3 through the channel stud CS, a fourth conductive line ML4 and the contact MC on the second common source line CSL2.

A source strapping line CSS may be disposed at the same vertical level as the bit lines BL and may electrically connect the common source lines CSL1 to CSL3 to each other. It will be understood that "elements at the same vertical level" refers to elements having top surfaces disposed at the substantially same height from the top surface of the substrate 100 and/or bottom surfaces disposed at the substantially same height from the top surface of the substrate 100. The elements at the same vertical level may have lower surfaces that are at an equal level and are coplanar each other. The same voltage may be applied to the common source lines CSL1 to CSL3 and the common source regions CSR disposed under the common source lines CSL1 to CSL3 through the source strapping line CSS. For example, a ground voltage may be applied to the common source regions CSR.

One or more source strapping line CSS may be provided in one cell array region (e.g., CAR of FIG. 2) between the row decoder regions (ROW DCR of FIG. 2) adjacent to each other. In some embodiment, a number of the source strapping line CSS provided in the one cell array region may be 1 to 5.

A width of the source strapping line CSS in the first direction D1 may be greater than those of the bit lines BL. For example, the width of the source strapping line CSS may be in a range from about 2 times to about 10 times the width of the bit line BL. The source strapping line CSS may overlap with a plurality of the conductive lines ML. The contacts MC overlapping with the source strapping line CSS may be connected to a bottom surface of the source strapping line CSS.

The source strapping line CSS may be connected to a plurality of the contacts MC in an overlapping region of the source strapping line CSS and each of the common source lines CSL1 to CSL3. In the case that two or more common source lines are provided, the number of the contacts MC connecting the source strapping line CSS to an odd-numbered common source line may be different from the number of the contacts MC connecting the source strapping line CSS to an even-numbered common source line. For example, when the first and second common source lines CSL1 and CSL2 are immediately adjacent each other and are disposed opposing sidewalls of one electrode structure, respectively, the number of the contacts MC connecting the source strapping line CSS to the first common source line CSL1 may be different from the number of the contacts MC connecting the source strapping line CSS to the second common source line CSL2. For example, the first common source line CSL1 may be electrically connected to the source strapping line CSS through two contacts MC, and the second common source line CSL2 may be electrically connected to the source strapping line CSS through three contacts MC as illustrated in FIG. 3.

Source studs CST may be provided between the conductive lines ML and the common source lines CSL1 to CSL3 in crossing regions (i.e., overlapping regions) of the source strapping line CSS and the common source lines CSL1 to CSL3. Each of the source studs CST may be connected to a plurality of conductive lines ML overlapping with the source strapping line CSS to electrically connect the plurality of conductive lines ML to each of the common source lines CSL1 to CSL3. In FIG. 4B, an interface exists between the conductive line ML and the source stud CST connected to each other. In some embodiments, the conductive lines ML and the source studs CST may be formed at the same time by, for example, a dual damascene process, so an interface between the source stud CST and the conductive lines ML may not exist or may not visible. The common source regions CSR may be electrically connected to the source strapping line CSS through the common source lines CSL1 to CSL3, the source studs CST, the conductive lines ML, and the contacts MC.

According to some embodiments of the inventive concepts, the source strapping line CSS which are electrically connected to the plurality of common source lines CSL1 to CSL3 to apply the same voltage thereto may be disposed between the bit lines BL in a plan view and may be disposed at the same level as the bit lines BL in a cross-sectional view, so the voltage may be applied to the common source regions CSR without an additional conductive line. As a result, manufacturing processes of the semiconductor memory device may be simplified and a vertical height of the semiconductor memory device may be reduced. In addition, the arrangement of the bit lines BL connected to the vertical channel structures VS may be optimized by the offset portions of conductive lines ML, and thus the integration density of the semiconductor memory device may be improved (i.e., increased).

A method for manufacturing a semiconductor memory device according to example embodiments will be described hereinafter. FIGS. 6, 8, 10, 12, 14, and 16 are plan views illustrating a method for manufacturing a semiconductor memory device according to example embodiments of the inventive concepts. FIGS. 7A, 9A, 11A, 13A, 15A, and 17A are cross-sectional views taken along the lines A-A' of FIGS. 6, 8, 10, 12, 14, and 16, respectively. FIGS. 7B, 9B, 11B, 13B, 15B, and 17B are cross-sectional views taken along the lines B-B' and C-C' of FIGS. 6, 8, 10, 12, 14, and 16, respectively.

Figure 6:
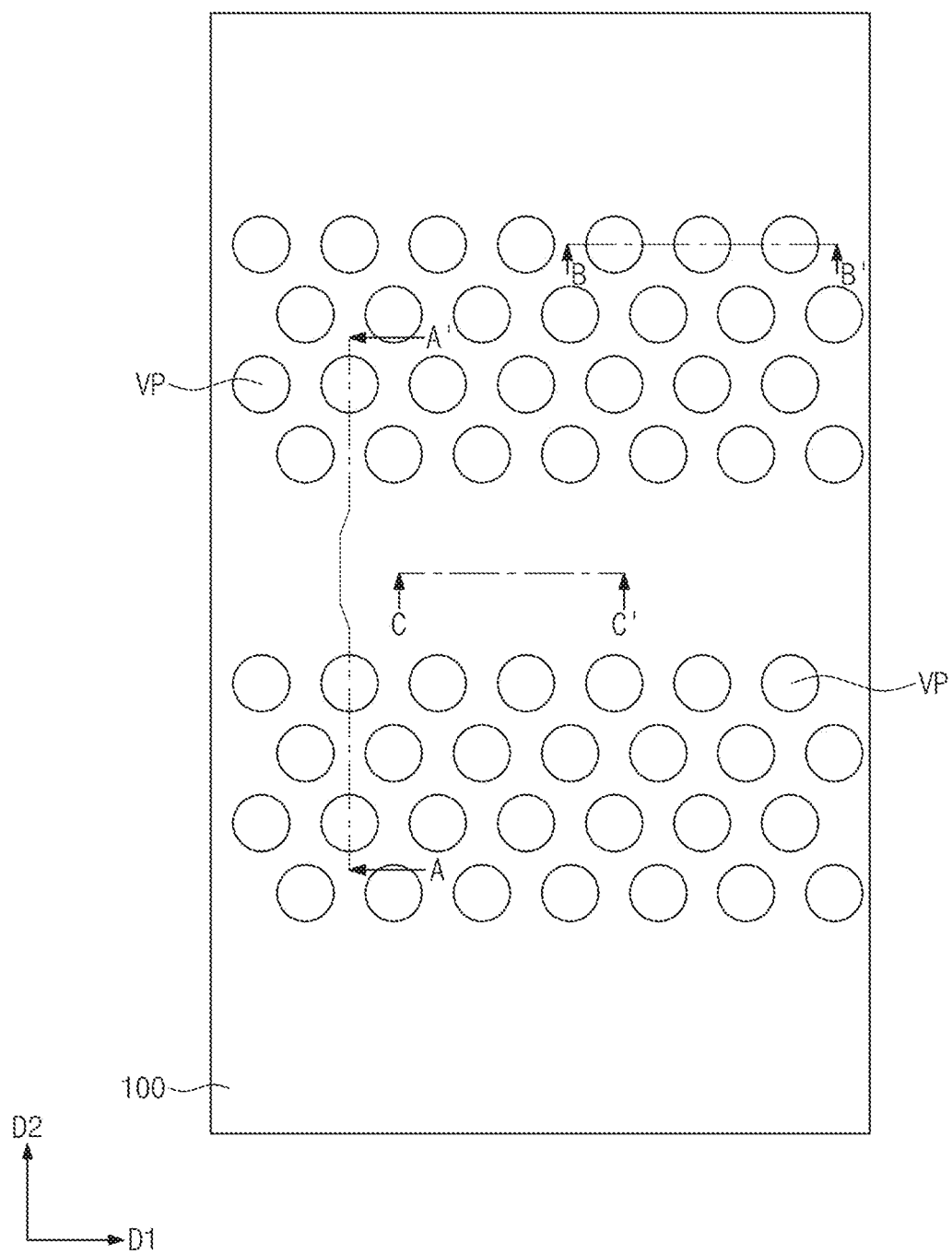
FIGS. 6, 8, 10, 12, 14, and 16 are plan views illustrating a method for manufacturing a semiconductor memory device according to example embodiments of the inventive concepts.
Figure 7A:
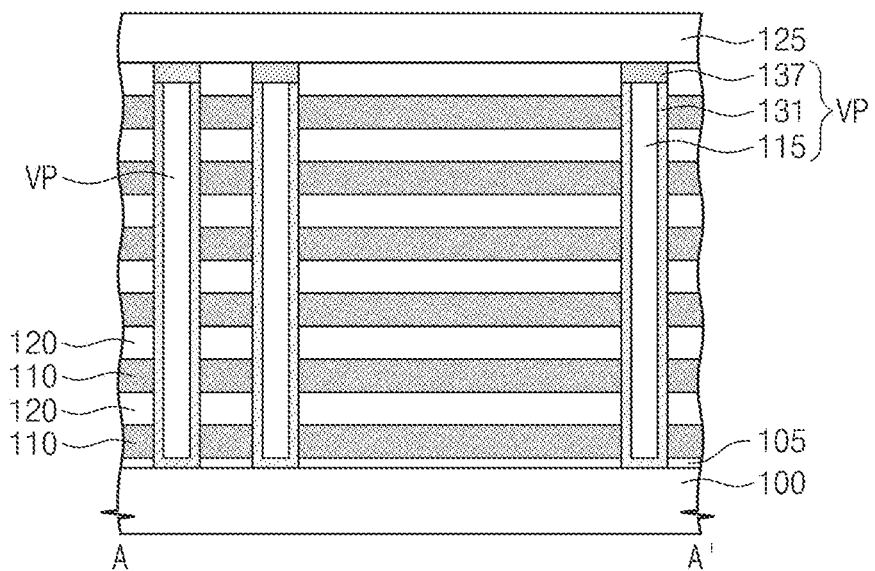
FIGS. 7A, 9A, 11A, 13A, 15A, and 17A are cross-sectional views taken along the lines A-A' of FIGS. 6, 8, 10, 12, 14, and 16, respectively.
Figure 7B:
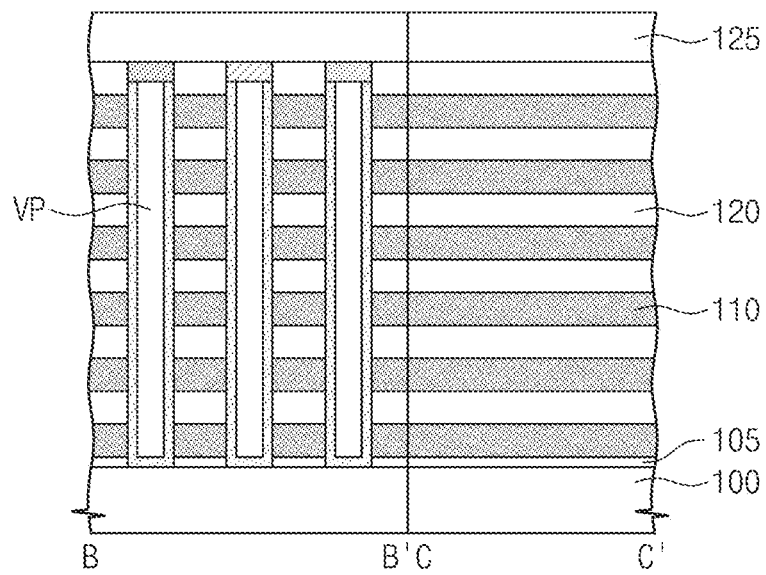
FIGS. 7B, 9B, 11B, 13B, 15B, and 17B are cross-sectional views taken along the lines B-B' and C-C' of FIGS. 6, 8, 10, 12, 14, and 16, respectively.

Referring to FIGS. 6, 7A, and 7B, a substrate 100 may be provided. The substrate 100 may be a silicon substrate, a germanium substrate, or a silicon-germanium substrate. The substrate 100 may be doped with dopants having a first conductivity type. For example, the first conductivity type may be a P-type. A buffer insulating layer 105 may be formed on the substrate 100. The buffer insulating layer 105 may include, for example, a silicon oxide layer. For example, the buffer insulating layer 105 may be formed by a thermal oxidation process. Second insulating layers 110 and first insulating layers 120 may be alternately and repeatedly stacked on the buffer insulating layer 105. The first insulating layers 120 and the second insulating layers 110 may be alternately and repeatedly stacked four or more times. In some embodiments, the first insulating layers 120 and the second insulating layers 110 may be alternately and repeatedly stacked ten or more times. The second insulating layers 110 may be formed of a material having an etch selectivity with respect to the first insulating layers 120. In other word, an etch rate of the second insulating layers 110 may be different from (e.g., higher than) that of the first insulating layers 120 during a process of etching the second insulating layers 110. The etch selectivity may be quantitatively represented by a ratio of the etch rate of the first insulating layers 120 to the etch rate of the second insulating layers 110. According to some embodiments, the ratio of the etch rate of the first insulating layers 120 to the etch rate of the second insulating layers 110 may be in a range of about 1:10 to about 1:200. In some embodiments the ratio of the etch rate of the first insulating layers 120 to the etch rate of the second insulating layers 110 maybe in a range of about 1:30 to about 1:100. For example, each of the second insulating layers 110 may be formed of a silicon nitride layer, a silicon oxynitride layer, or a poly-silicon layer, and each of the first insulating layers 120 may be formed of a silicon oxide layer. The insulating layers 110 and 120 may be formed by chemical vapor deposition (CVD) processes.

Vertical channel structures VP may be formed to penetrate the insulating layers 110 and 120. The vertical channel structures VP may be connected to the substrate 100. The vertical channel structures VP may be two-dimensionally arranged on the substrate 100. In some embodiments, the vertical channel structures VP may constitute a plurality of lines (e.g., rows) extending in a first direction D1 parallel to a top surface of the substrate 100 and arranged along a second direction D2 intersecting the first direction D1. The vertical channel structures VP may be formed in a plurality of regions separated from each other in consideration of positions at which common source lines to be described below will be formed. Odd-numbered vertical channel structures VP of the vertical channel structures VP constituting one column may be offset from even-numbered vertical channel structures VP of the one column in the second direction D2. The channel structures VP may form multiple rows that extend in the first direction and some of the channel structures VP included in two immediately adjacent rows may be arranged in a zigzag pattern as illustrated in FIG. 6.

Forming the vertical channel structures VP may include forming through holes penetrating the insulating layers 110 and 120, and sequentially forming a semiconductor pattern 131 and a filling insulation pattern 115 in each of the through holes. The through holes may be formed using an anisotropic etching process performed on the insulating layers 110 and 120. The semiconductor pattern 131 may be conformally formed on a sidewall and a bottom surface of each of the through holes, and the filling insulation pattern 115 may be formed on the semiconductor pattern 131 to fill each of the through holes. Upper portions of the filling insulation pattern 115 and the semiconductor pattern 131 may be removed, and then, a pad pattern 137 may be formed to fill an empty region formed by the removal of the upper portions of the filling insulation pattern 115 and the semiconductor pattern 131. For example, the semiconductor pattern 131 may include at least one of silicon, germanium, or silicon-germanium. In some embodiments, a conductive layer (e.g., a doped semiconductor, a metal, a conductive metal nitride and/or a silicide) or a nanostructure (e.g., a carbon nanotube or a graphene) may be provided instead of the semiconductor pattern 131. Hereinafter, the semiconductor pattern 131 will be described as an example for the purpose of ease and convenience in explanation. The semiconductor pattern 131 and the filling insulation pattern 115 may be formed using a CVD process and/or an atomic layer deposition (ALD) process.

The filling insulation pattern 115 may include, for example, at least one of a silicon oxide layer, a silicon nitride layer, or a silicon oxynitride layer. The pad pattern 137 may include, for example, at least one of a doped semiconductor, a metal, a metal silicide, or a metal nitride. After the formation of the pad pattern 137, a first interlayer insulating layer 125 may be formed to cover the pad patterns 137. For example, the first interlayer insulating layer 125 may include a silicon oxide layer or a silicon oxynitride layer.

Figure 8:
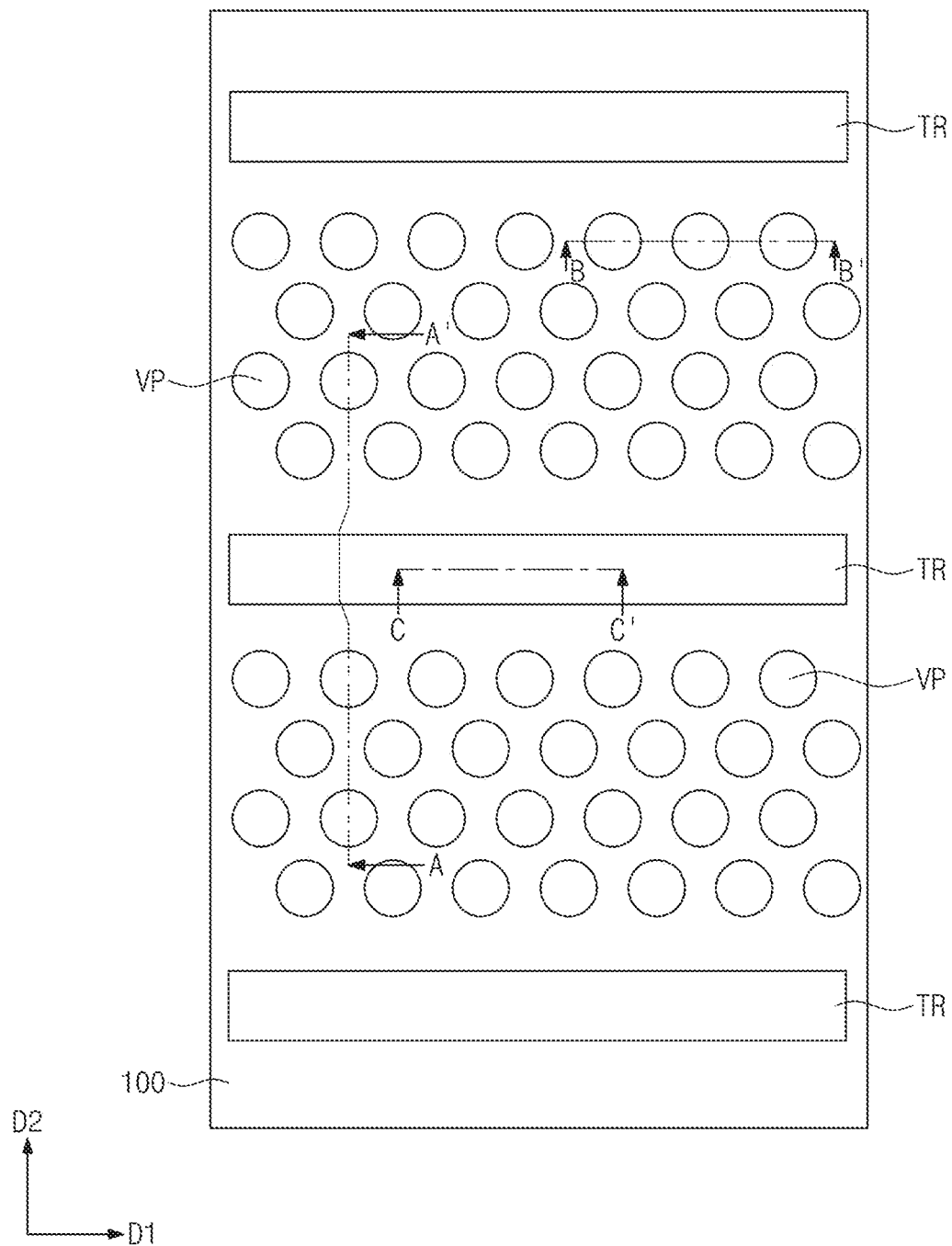
Figure 9A:
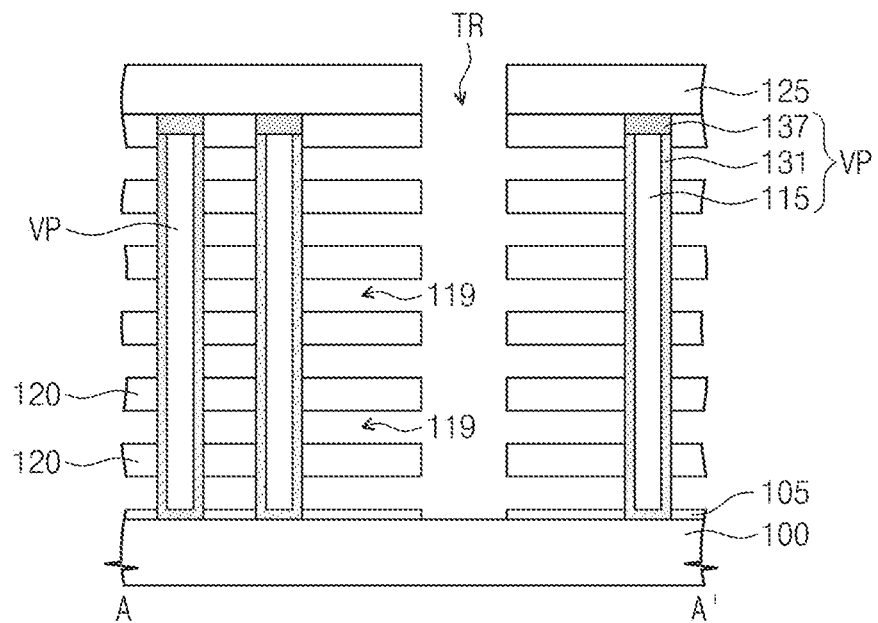
Figure 9B:
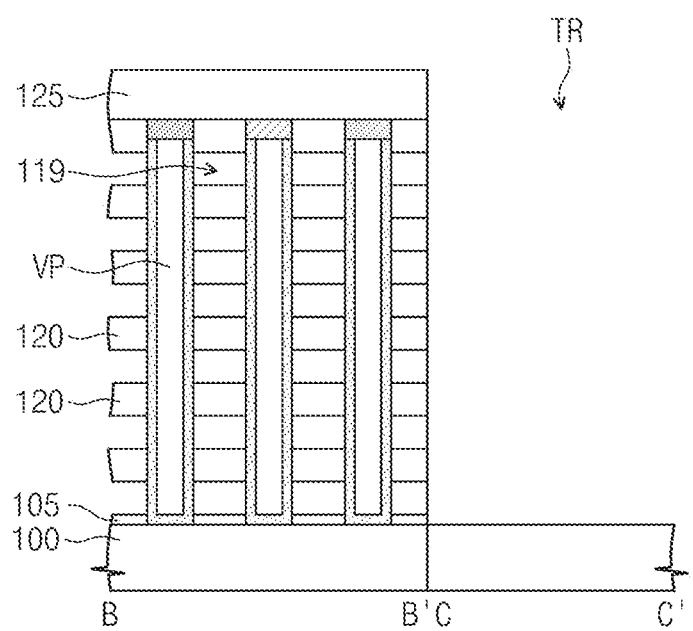

Referring to FIGS. 8, 9A, and 9B, a plurality of trenches TR may be formed to extend in the first direction D1 between the vertical channel structures VP. The trenches TR may penetrate the first interlayer insulating layer 125 and the second and first insulating layers 110 and 120 to expose the top surface of the substrate 100. The second insulating layers 110 of which sidewalls are exposed by the trenches TR may be removed to form recess regions 119. In other word, the recess regions 119 may correspond to empty regions formed by the removal of the second insulating layers 110. When the second insulating layers 110 include silicon nitride layers or silicon oxynitride layers, the recess regions 119 may be formed using an etching solution including phosphoric acid. The recess regions 119 may expose portions of a sidewall of the semiconductor pattern 131. The second insulating layers 110 may not be completely removed but portions of the second insulating layers 110 may remain between the first insulating layers 120.

Figure 10:
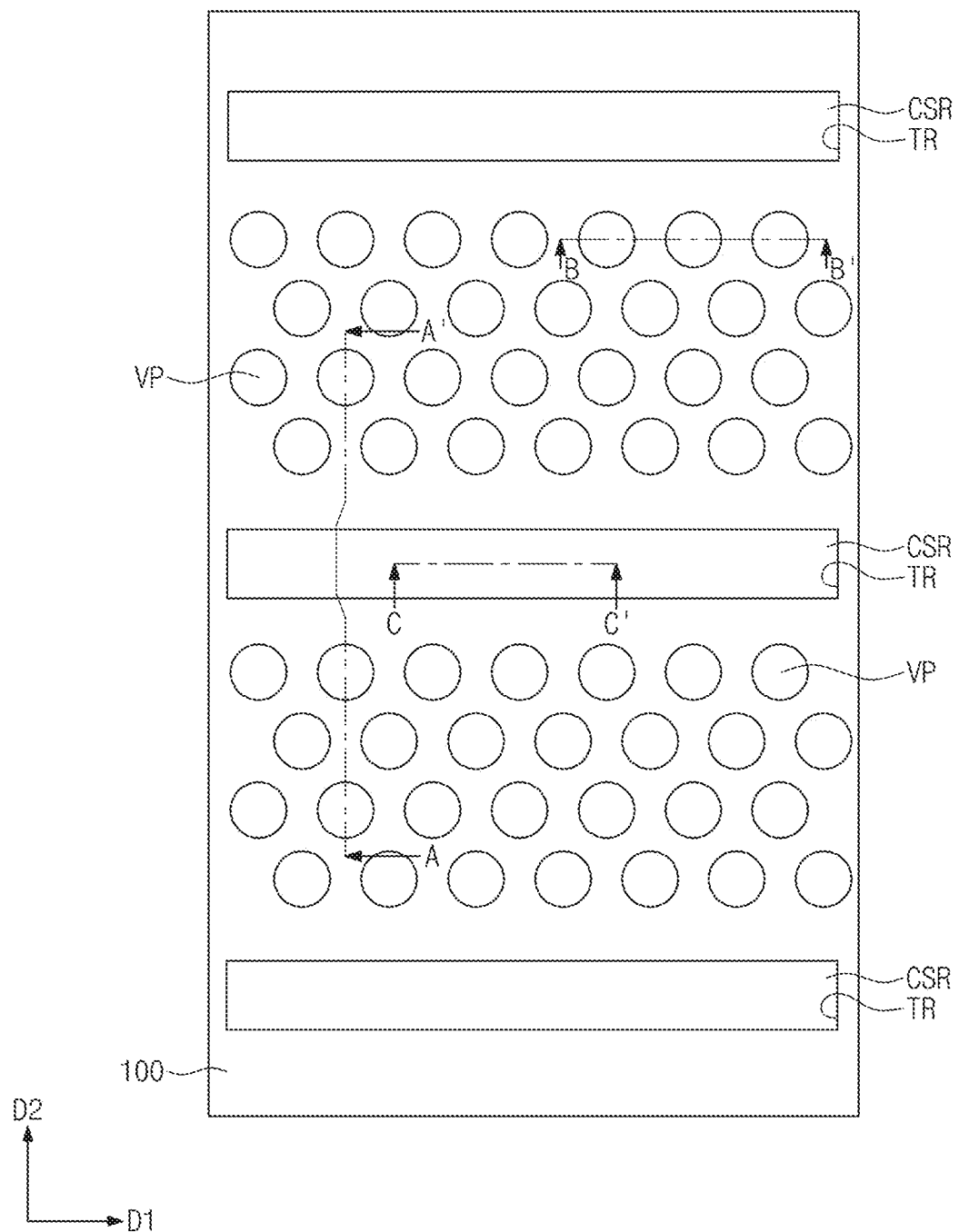
Figure 11A:
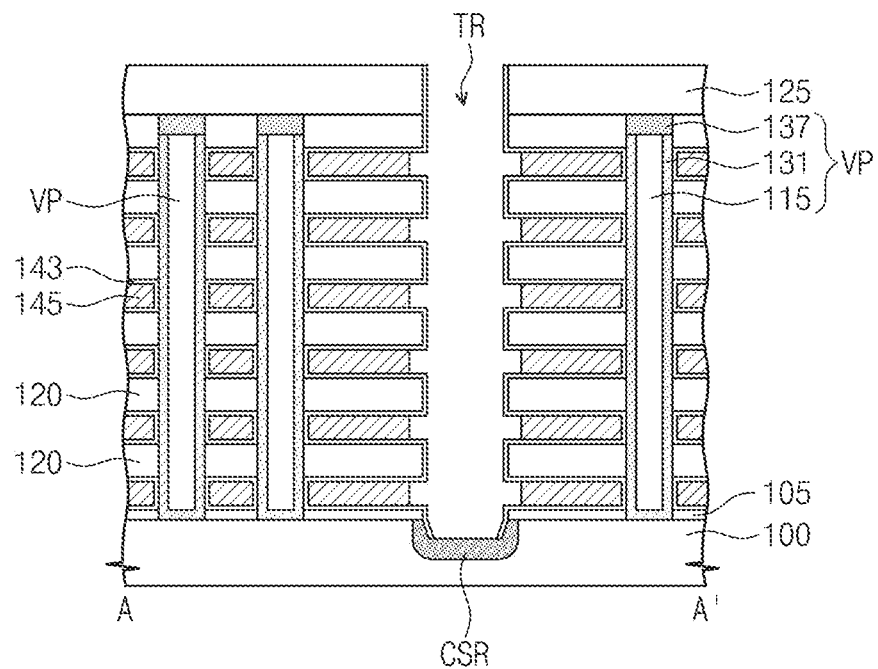
Figure 11B:
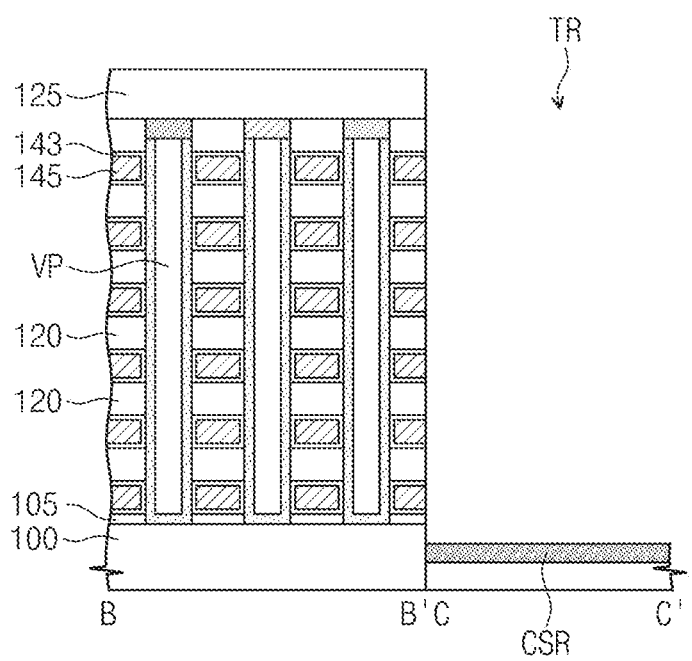

Referring to FIGS. 10, 11A, and 11B, a data storage layer and a conductive layer may be sequentially formed in the recess regions 119, and then the data storage layer and the conductive layer disposed outside the recess regions 119 may be removed to form electrode layers 145 and data storage layers 143. The electrode layers 145 may be vertically separated from each other by the first insulating layers 120, and the data storage layers 143 may also be vertically separated from each other by the first insulating layers 120. The electrode layers 145 may completely fill the recess regions 119 having the data storage layers 143 or may not fill portions of the recess regions 119 which are adjacent to the trenches TR as illustrated in FIG. 11A. In some embodiments, each of the data storage layers 143 may include a tunnel insulating layer, a charge storage layer on the tunnel insulating layer and a blocking insulating layer on the charge storage layer. In some embodiments, each of the data storage layers 143 may be a variable resistance pattern. For example, the electrode layers 145 may be formed of at least one of doped silicon, a metal, a metal silicide, or a conductive metal nitride. The blocking insulating layer may include a high-k dielectric layer such as an aluminum oxide layer or a hafnium oxide layer. The charge storage layer may include a charge trapping layer or an insulating layer including conductive nano particles. For example, the charge trapping layer may include a silicon nitride layer. The tunnel insulating layer may include, for example, a silicon oxide layer. In the process of forming the data storage layers 143 and the electrode layers 145, the substrate 100 exposed by the trenches TR may be additionally recessed.

Common source regions CSR may be formed in an upper portion of the substrate 100 exposed by the trenches TR. The common source regions CSR may be regions doped with dopants having a second conductivity type different from the first conductivity type. For example, the common source regions CSR may be N-type dopant regions. The common source regions CSR may be formed after the formation of the electrode layers 145. However, the inventive concepts are not limited thereto. In some embodiments, the common source regions CSR may be formed after the formation of the trenches TR and before the removal of the second insulating layers 110.

Figure 12:
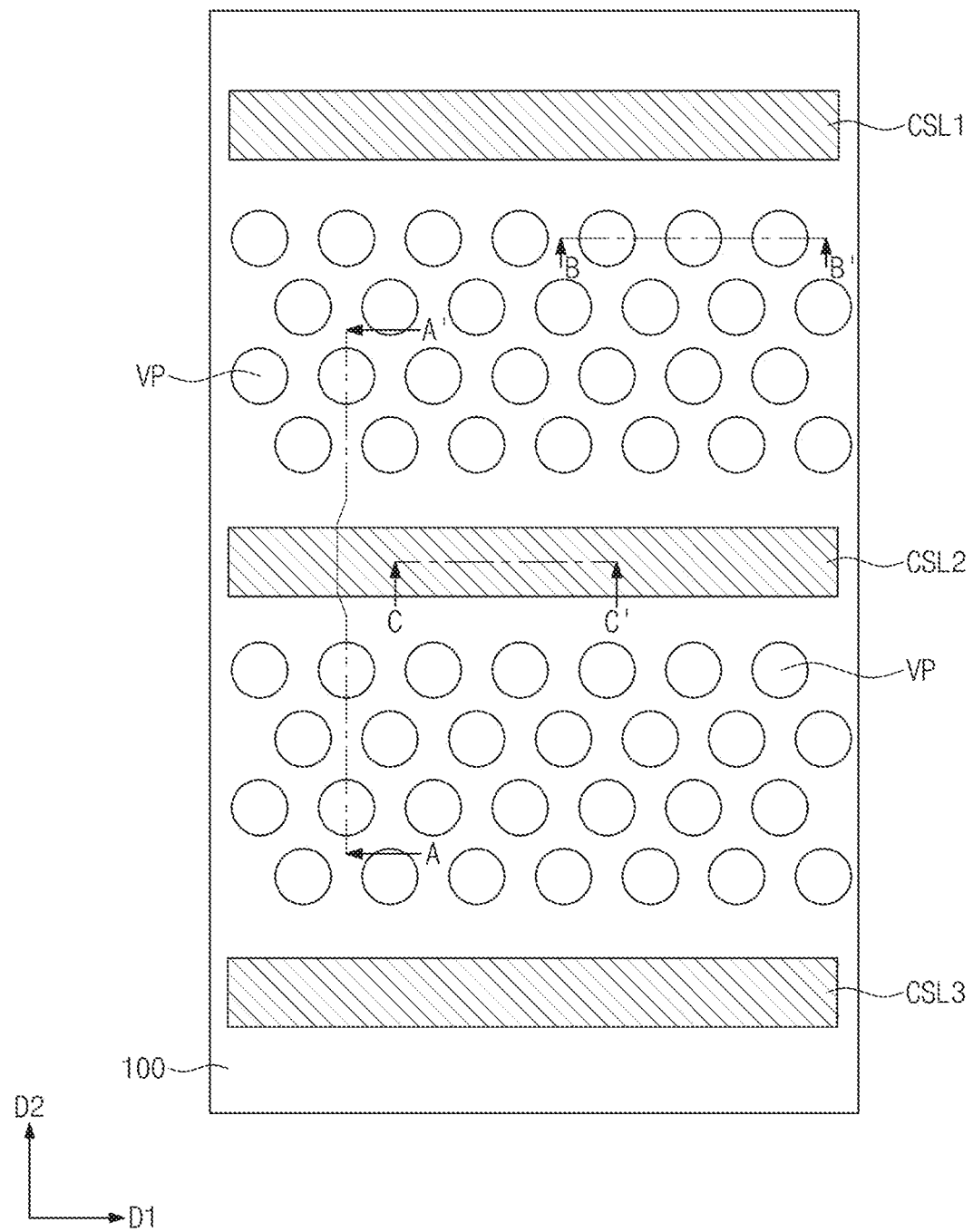
Figure 13A:
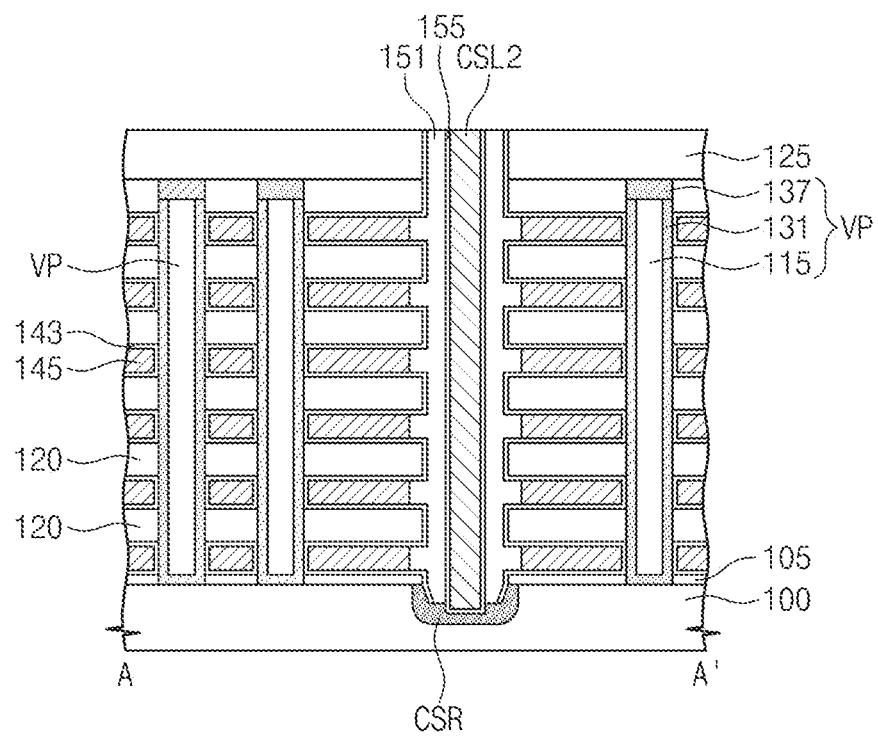
Figure 13B:
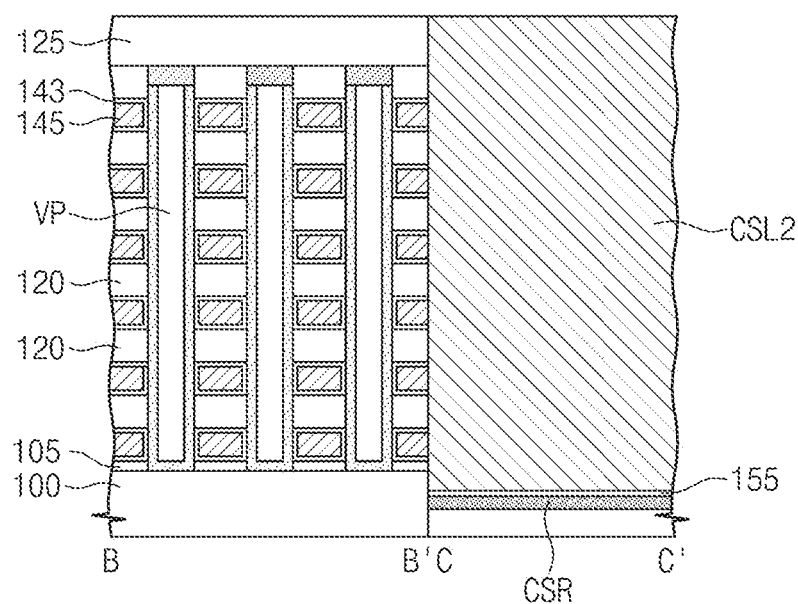

Referring to FIGS. 12, 13A, and 13B, a spacer insulating layer 151 may be formed on a sidewall of each of the trenches TR. An insulating layer may be conformally formed along sidewalls and bottom surfaces of the trenches TR, and an anisotropic etching process may be performed on the insulating layer until the common source regions CSR are exposed, thereby forming the spacer insulating layers 151. Barrier layers 155 and common source lines CSL1 to CSL3 may be formed in the trenches TR having the spacer insulating layers 151, respectively. The common source lines CSL1 to CSL3 may extend along a longitudinal direction of the trenches TR to have plate shape that extends perpendicular to the top surface of the substrate 100. The barrier layer 155 may extend on a bottom surface of each of the common source lines CSL1 to CSL3. In some embodiments, the common source lines CSL1 to CSL3 may include tungsten. However, the inventive concepts are not limited thereto. In some embodiments, the common source lines CSL1 to CSL3 may include at least one of conductive materials such as a metal (e.g., copper or aluminum), a doped semiconductor and a conductive metal nitride. The barrier layer 155 may include, for example, a metal (e.g., titanium or tantalum) and/or a metal nitride (e.g., titanium nitride or tantalum nitride). The spacer insulating layer 151 may include, for example, at least one of a silicon oxide layer, a silicon nitride layer, or a silicon oxynitride layer. Thereafter, a planarization process may be performed to expose top surfaces of the common source lines CSL1 to CSL3.

Figure 14:
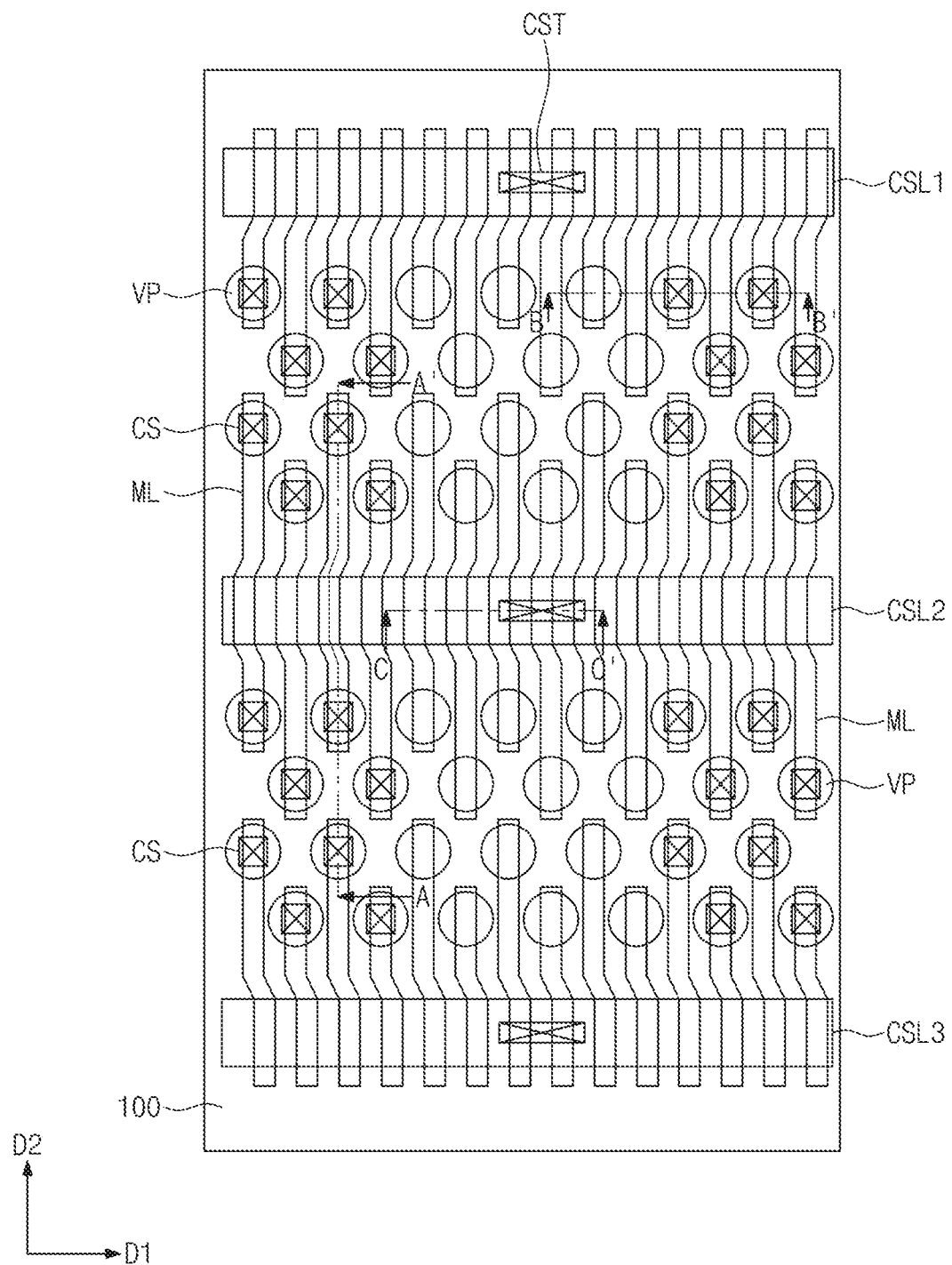
Figure 15A:
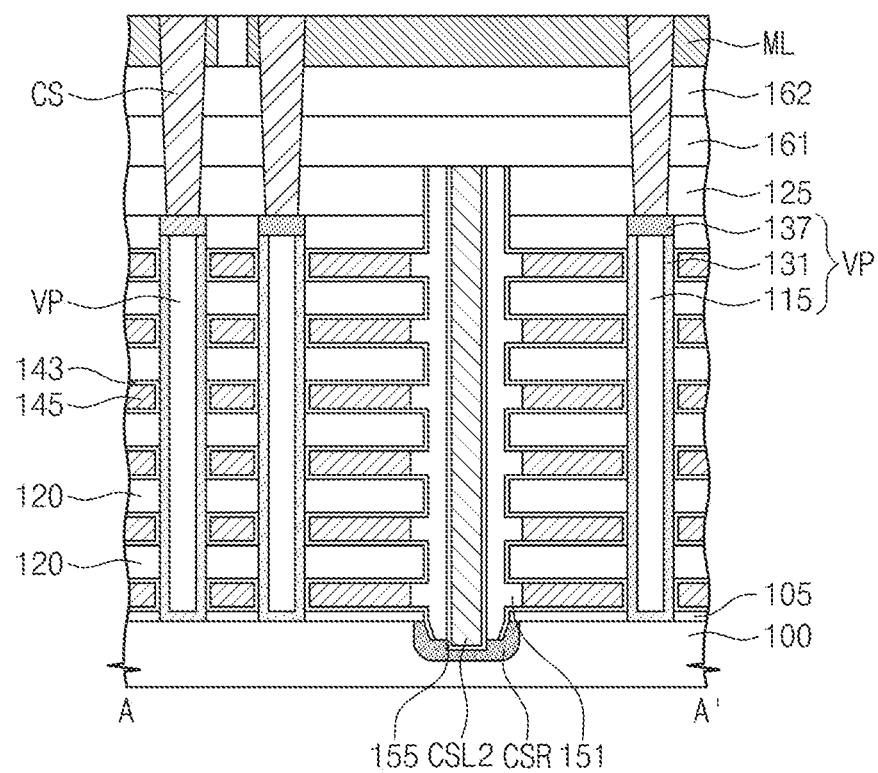
Figure 15B:
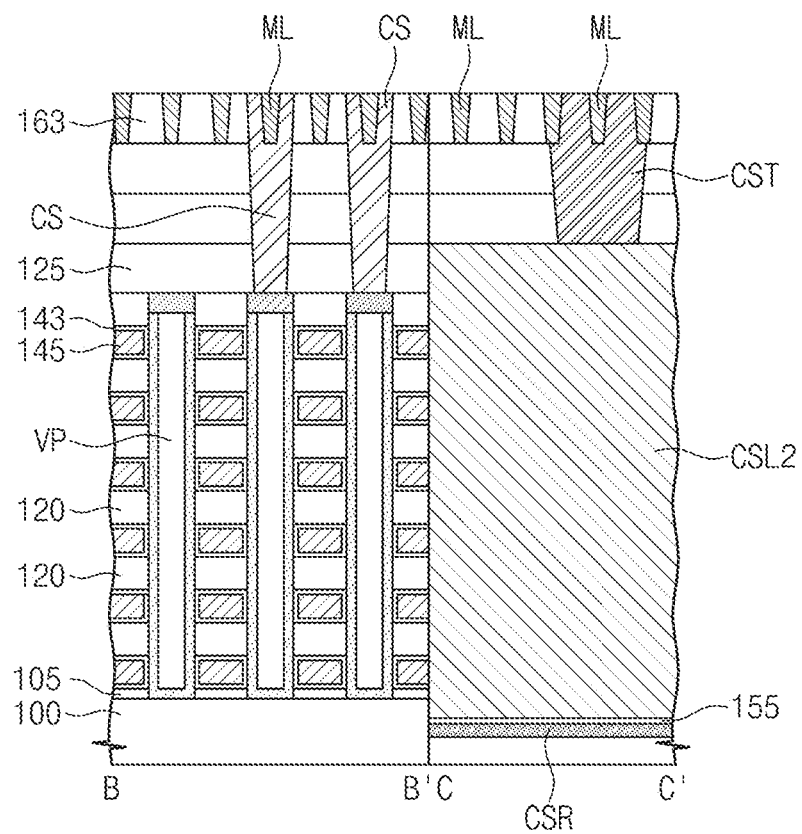

Referring to FIGS. 14, 15A, and 15B, second to fourth interlayer insulating layers 161, 162, and 163 may be formed on the first interlayer insulating layer 125. Conductive lines ML, channel studs CS, and source studs CST may be formed in the first to fourth interlayer insulating layers 125, 161, 162, and 163. The channel studs CS may be connected to top ends of the vertical channel structures VP, and the source studs CST may be connected to the top surfaces of the common source lines CSL1 to CSL3. The conductive lines ML may be connected to the channel studs CS or the source studs CST and may extend to above the vertical channel structures VP. In some embodiments, the conductive lines ML, the channel studs CS and the source studs CST may be formed using a dual damascene process. In this case, interfaces between the conductive lines ML and the channel studs CS and interfaces between the conductive lines ML and the source studs CST may not exist or may not visible. The channel studs CS may not be formed on some vertical channel structures VP.

Figure 16:
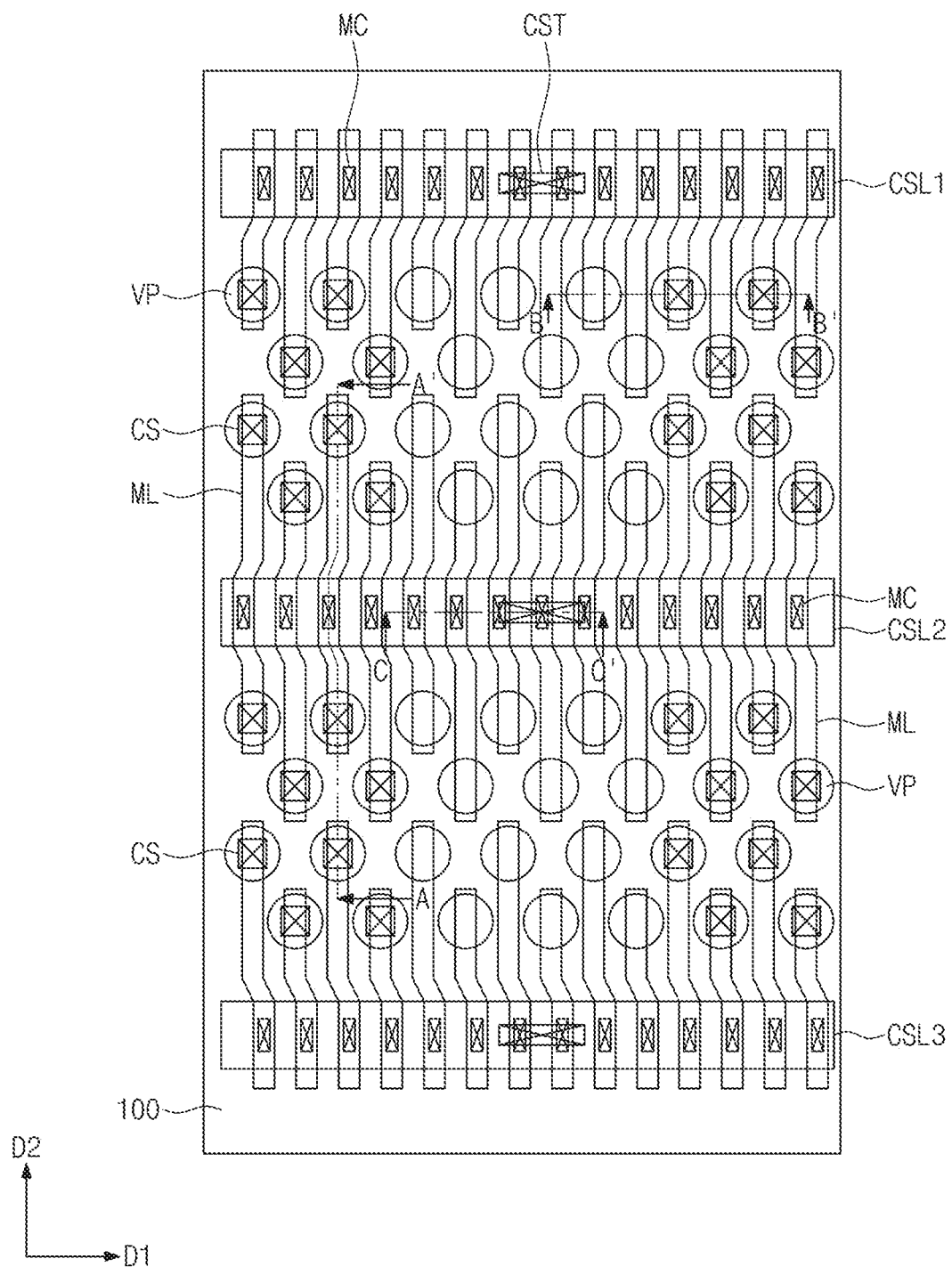
Figure 17A:
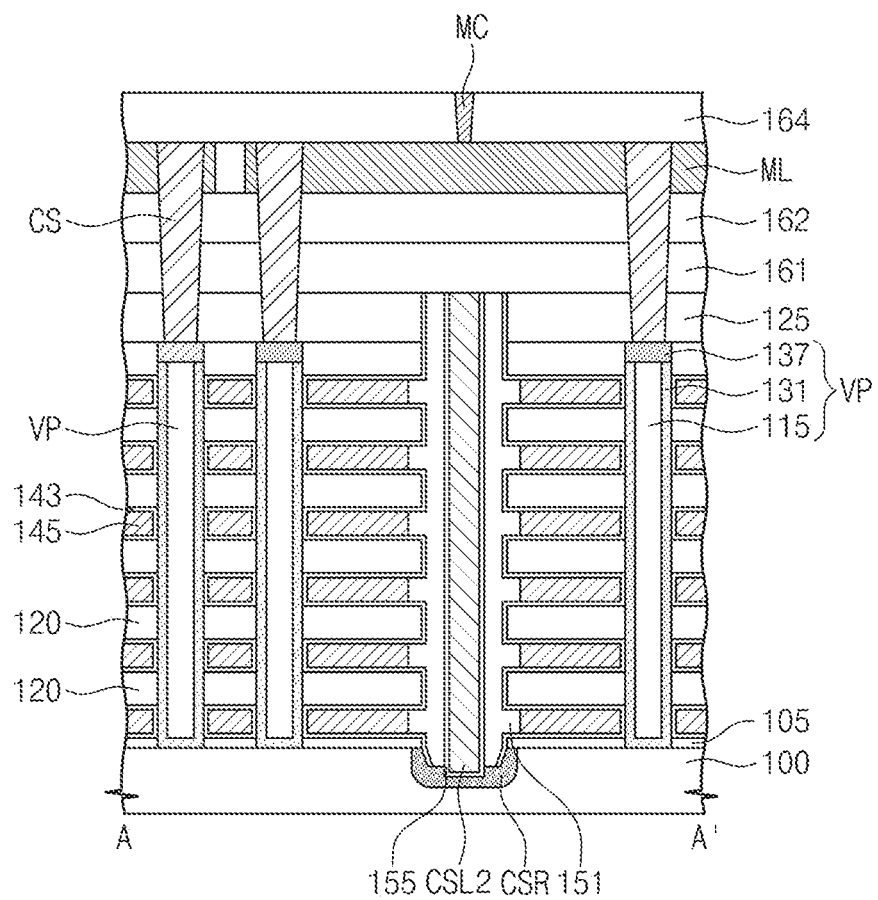
Figure 17B:
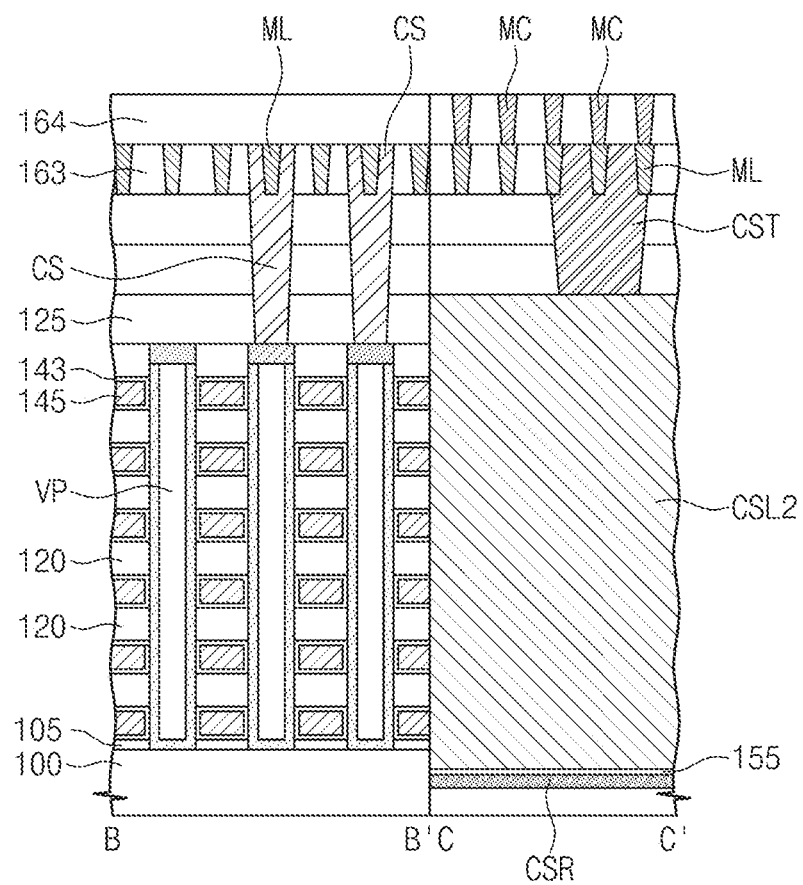

Referring to FIGS. 16, 17A, and 17B, contacts MC may be formed above the common source lines CSL1 to CSL3 so as to be arranged along a longitudinal direction (e.g., first direction D1) of the common source lines CSL1 to CSL3. A fifth interlayer insulating layer 164 may be formed on the fourth interlayer insulating layer 163, and the contacts MC may be formed to penetrate the fifth interlayer insulating layer 164. The contacts MC may be formed to be aligned with the conductive lines ML, respectively.

Referring again to FIGS. 3, 4A, and 4B, bit lines BL and a source strapping line CSS may be formed on the contacts MC. A sixth interlayer insulating layer 165 may be formed on the fifth interlayer insulating layer 164, and the bit lines BL and the source strapping line CSS may be formed to penetrate the sixth interlayer insulating layer 165. The bit lines BL and the source strapping line CSS may be connected to the contacts MC. The bit lines BL and the source strapping line CSS may be formed of the same material by the same process.

The interlayer insulating layers 125 and 161 to 165 may include, for example, silicon oxide layers. For example, the contacts MC, the bit lines BL, the conductive lines ML, and the studs CS and CST may include at least one of a metal (e.g., copper or aluminum) or a conductive metal nitride (e.g., titanium nitride or tantalum nitride).

According to example embodiments of the inventive concepts, the source strapping line CSS which are electrically connected to the plurality of common source lines CSL1 to CSL3 to apply the same voltage thereto may be disposed between the bit lines BL in a plan view and may be disposed at the same level as the bit lines BL in a cross-sectional view, so a ground voltage may be applied in common to the common source regions CSR without formation of an additional conductive line. As a result, the manufacturing processes of the semiconductor memory device may be simplified and a vertical height of the semiconductor memory device may be reduced. In addition, the arrangement of the bit lines BL connected to the vertical channel structures VS may be optimized by the offset portions of the conductive lines ML, so the integration density of the semiconductor memory device may be improved (e.g., increased).

Figure 18:
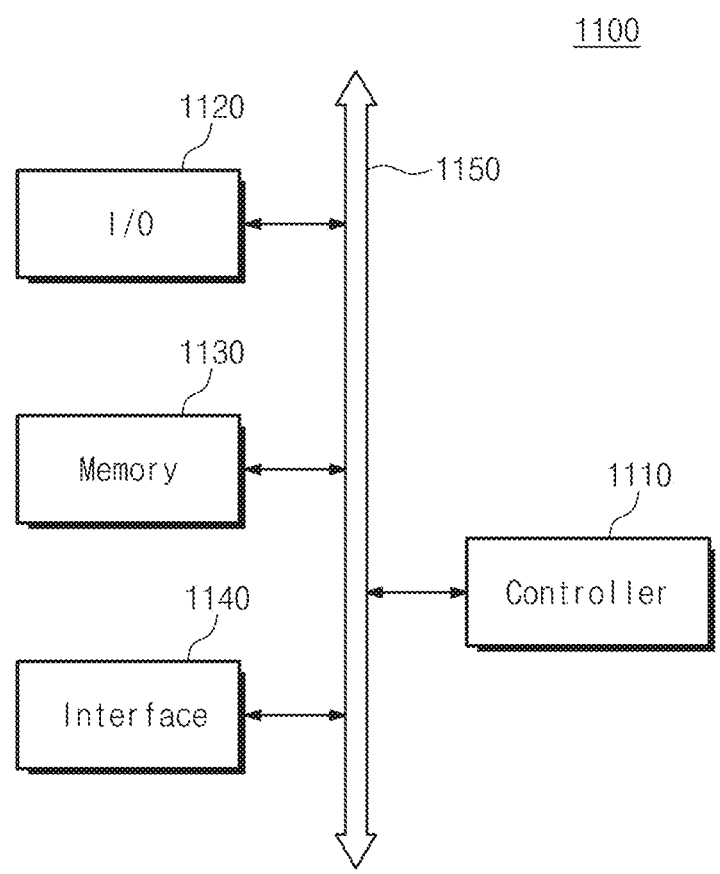
FIG. 18 is a schematic block diagram illustrating an example of an electronic system including a semiconductor memory device according to example embodiments of the inventive concepts.

FIG. 18 is a schematic block diagram illustrating an example of an electronic system including a semiconductor memory device according to example embodiments of the inventive concepts.

Referring to FIG. 18, an electronic system 1100 according to some embodiments of the inventive concepts may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The memory device 1130 may include at least one of the semiconductor memory devices according to some embodiments of the inventive concepts.

The controller 1110 may include at least one of a microprocessor, a digital signal processor, a microcontroller, or other logic devices having a similar function to any one thereof. The I/O unit 1120 may include a keypad, a keyboard and/or a display device. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna or a cable/wireless transceiver. Although not shown in the drawings, the electronic system 1100 may further include a fast dynamic random access memory (fast DRAM) device and/or a fast static random access memory (fast SRAM) device which acts as a cache memory for improving operations of the controller 1110.

The electronic system 1100 may be applied to a personal digital assistant (PDA), a portable computer, a web tablet, a wireless phone, a mobile phone, a digital music player, a memory card, or other electronic products receiving and/or transmitting information data by wireless.

Figure 19:
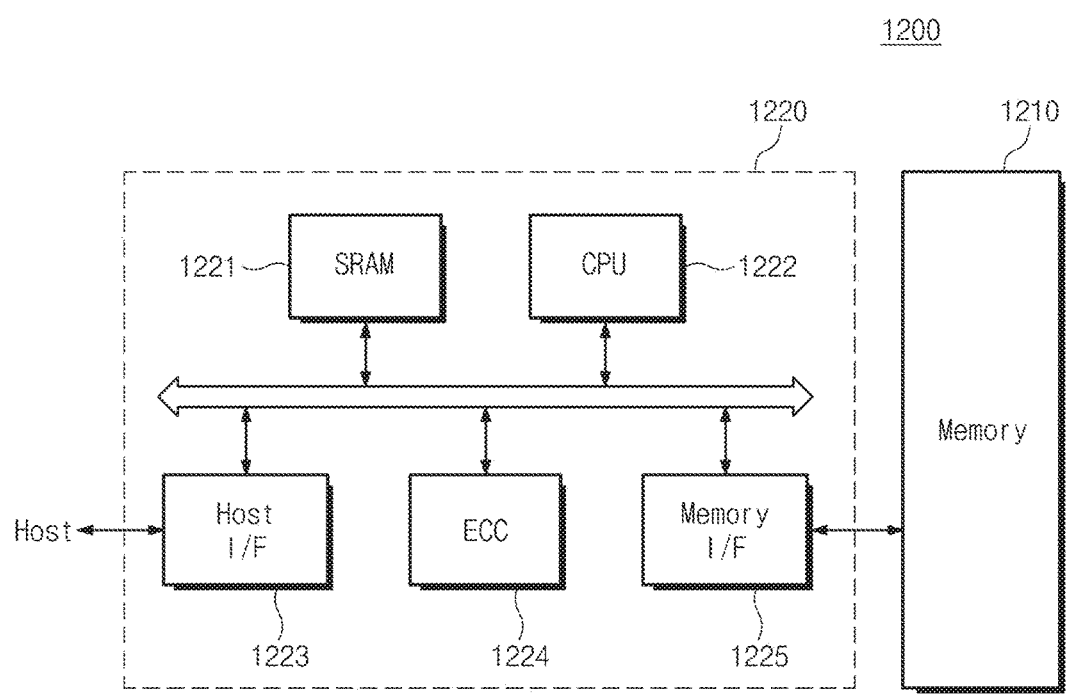
FIG. 19 is a schematic block diagram illustrating an example of a memory card including a semiconductor memory device according to example embodiments of the inventive concepts.

FIG. 19 is a schematic block diagram illustrating an example of a memory card including a semiconductor memory device according to example embodiments of the inventive concepts.

Referring to FIG. 19, a memory card 1200 may include a memory device 1210. The memory device 1210 may include at least one of the semiconductor memory devices according to some embodiments of the inventive concepts. In addition, the memory device 1210 may further include another type of semiconductor memory devices (e.g., a DRAM device and/or an SRAM device). The memory card 1200 may further include a memory controller 1220 that controls data communication between a host and the memory device 1210. The memory device 1210 and/or the memory controller 1220 may include at least one of the semiconductor memory devices according to some embodiments of the inventive concepts.

The memory controller 1220 may include a central processing unit (CPU) 1222 that controls overall operations of the memory card 1200. In addition, the memory controller 1220 may include an SRAM device 1221 used as a working memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data for interfacing with the host. The memory card 1200 may be used as a portable data storage card. Alternatively, the memory card 1200 may be realized as solid state disks (SSD) which are used as hard disks of computer systems.

Figure 20:
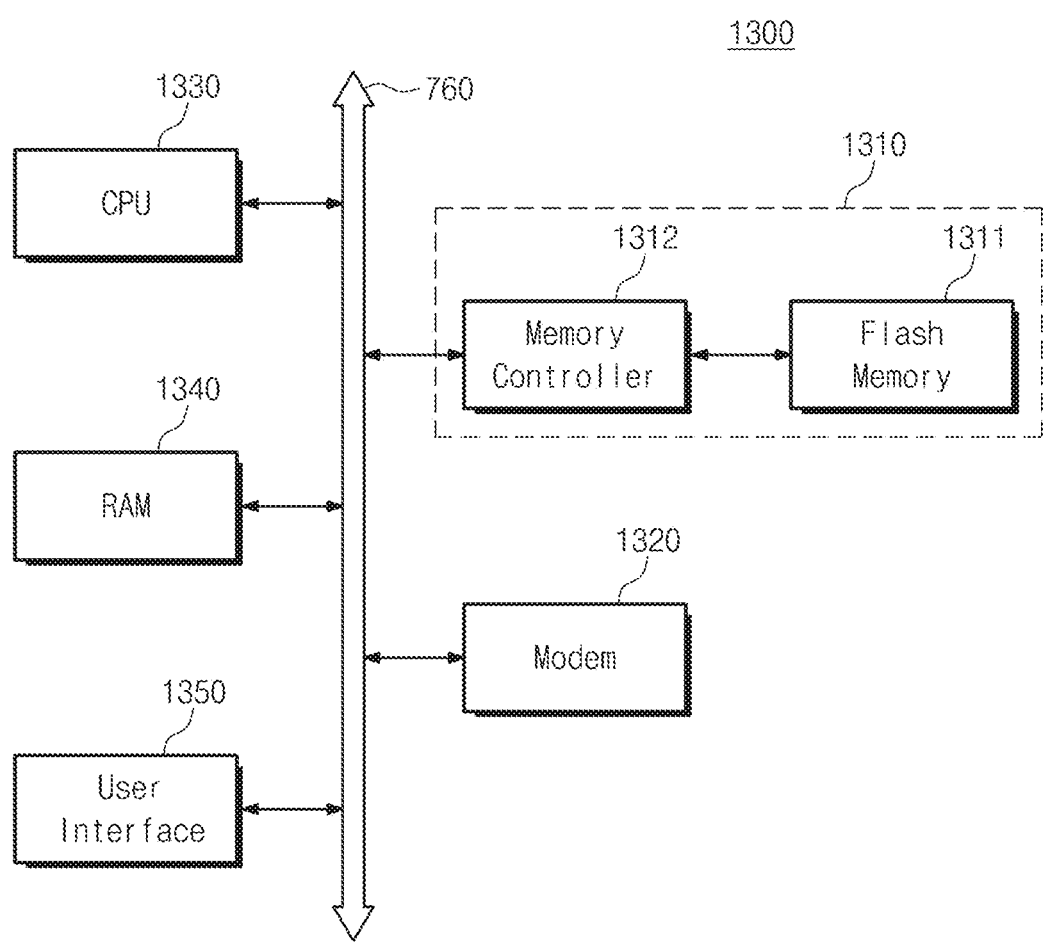
FIG. 20 is a schematic block diagram illustrating an example of an information processing system including a semiconductor memory device according to example embodiments of the inventive concepts.

FIG. 20 is a schematic block diagram illustrating an example of an information processing system including a semiconductor memory device according to example embodiments of the inventive concepts.

Referring to FIG. 20, a flash memory system 1310 according to some embodiments of the inventive concepts may be installed in an information processing system such as a mobile device or a desk top computer. An information processing system 1300 according to some embodiments of the inventive concepts may include a modem 1320, a CPU 1330, a RAM 1340 and a user interface unit 1350 which are electrically connected to the flash memory system 1310 through a system bus 1360. The flash memory system 1310 may have the substantially same structure as the memory card described above. In other words, the flash memory system 1310 may include a memory device 1311 and a memory controller 1312. The flash memory system 1310 may store data processed by the CPU 1330 or data inputted from an external system. In some embodiments, the flash memory system 1310 may be realized as a solid state disk (SSD). In this case, the information processing system 1300 may stably store massive data into the flash memory system 1310. In addition, as reliability of the flash memory system 1310 is improved, the flash memory system 1310 may reduce a resource consumed for correcting errors. Thus, the information processing system 1300 may perform a fast data communication function. Even though not shown in the drawings, the information processing system 1300 may further include an application chipset, a camera image processor (CIS), and/or an input/output (I/O) unit.

The semiconductor memory devices and/or the memory card described above may be encapsulated using various packaging techniques. For example, the semiconductor memory devices and/or the memory card according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOP) technique, a shrink small outline package (S SOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique.

In semiconductor memory devices according to the inventive concepts, the source strapping line electrically connected to the plurality of common source lines to apply the same voltage to the common source lines may be formed at the same level as the bit lines. Thus, the voltage may be applied to the common source regions without an additional conductive line. In addition, the arrangement of the bit lines may be optimized by the offset regions of the conductive lines.

While the inventive concepts have been described with reference to example embodiments, it will be apparent to those skilled in the art that various changes and modifications may be made without departing from the spirits and scopes of the inventive concepts. Therefore, it should be understood that the embodiments discussed herein are not limiting, but illustrative. Thus, the scopes of the inventive concepts are to be determined by the broadest permissible interpretation of the following claims and their equivalents and shall not be restricted or limited by the foregoing description.

What is claimed is:

1. A semiconductor memory device comprising:
a plurality of vertical channel structures on a substrate, the plurality of vertical channel structures vertically extending from the substrate;
a plurality of bit lines on the plurality of vertical channel structures, each of the plurality of bit lines being commonly connected to ones of the plurality of vertical channel structures, wherein the plurality of bit lines are spaced apart from each other in a first direction;
a common source region extending in a second direction, wherein the second direction intersects the first direction, and both the first direction and the second direction are horizontal directions, and wherein ones of the plurality of bit lines overlap the common source region;
a plurality of common source lines extending in the second direction on the substrate, wherein one of the plurality of common source lines extends between a first one of the plurality of vertical channel structures and a second one of the plurality of vertical channel structures, and wherein the one of the plurality of common source lines overlaps and is electrically connected to the common source region; and
a source strapping line electrically connected to the plurality of common source lines, a lower surface of the source strapping line and lower surfaces of the plurality of bit lines being at an equal level.

2. The semiconductor memory device of claim 1, wherein a width of the source strapping line in the second direction is greater than a width of each of the plurality of bit lines in the second direction.

3. The semiconductor memory device of claim 1, further comprising:
a plurality of contacts, each of the plurality of contacts overlapping a respective one of the plurality of common source lines in plan view,
wherein ones of the plurality of contacts electrically connect respective ones of the plurality of vertical channel structures to respective ones of the plurality of bit lines, and
wherein the source strapping line overlaps at least two of the plurality of contacts and the one of the plurality of common source lines.

4. The semiconductor memory device of claim 3, further comprising:
a plurality of conductive lines, wherein each of the plurality of conductive lines is connected to a bottom surface of one of the plurality of contacts, and
wherein each of the plurality of conductive lines intersects a respective one of the plurality of common source lines and extends on the plurality of vertical channel structures.

5. The semiconductor memory device of claim 4, wherein ones of the plurality of conductive lines intersecting the respective one of the plurality of common source lines have asymmetrical lengths with respect to the respective one of the plurality of common source lines.

6. The semiconductor memory device of claim 4, wherein the plurality of conductive lines extend in the first direction, and
wherein each of the plurality of conductive lines comprises an offset portion that overlaps a respective one of the plurality of common source lines in plan view and is offset from the first direction toward the second direction.

7. The semiconductor memory device of claim 4, wherein the plurality of common source lines comprise a first common source line and a second common source line adjacent to the first common source line,
wherein the plurality of conductive lines extend in the first direction and comprise a first conductive line intersecting the first common source line and a second conductive line intersecting the second common source line,
wherein the first conductive line comprises a first offset portion that is offset from the first direction toward the second direction and overlaps the first common source line in plan view, and
wherein the second conductive line comprises a second offset portion that is offset from the first direction toward a third direction that is opposite to the second direction and overlaps the second common source line in plan view.

8. The semiconductor memory device of claim 3, wherein the plurality of common source lines comprise a first common source line and a second common source line adjacent to the first common source line,
wherein the plurality of bit lines comprise odd-numbered bit lines and even-numbered bit lines arranged in the second direction in an alternating sequence,
wherein each of the odd-numbered bit lines is connected to a respective one of first ones of the plurality of contacts that overlap the first common source line in plan view, and
wherein each of the even-numbered bit lines is connected to a respective one of second ones of the plurality of contacts that overlap the second common source line in plan view.

9. The semiconductor memory device of claim 1, wherein a lower surface of the one of the plurality of common source lines faces the substrate and is closer to the substrate than upper surfaces of the first one and second one of the plurality of vertical channel structures.

10. A semiconductor memory device comprising:
an electrode structure on a substrate, the electrode structure including a plurality of electrodes vertically stacked on the substrate;
a plurality of vertical channel structures extending through the electrode structure and being connected to the substrate;
first and second common source lines at respective opposing sides of the electrode structure, the first and second common source lines extending in a first direction;
a plurality of contacts on the first and second common source lines, the plurality of contacts being arranged in the first direction;
a plurality of bit lines extending in a second direction that intersects the first direction, each of the plurality of bit lines being electrically connected to one of the plurality of vertical channel structures; and
a source strapping line electrically connecting the first and second common source lines to each other, wherein each of the first and second common source lines is connected to the source strapping line through at least two of the plurality of contacts interposed therebetween.

11. The semiconductor memory device of claim 10, wherein a number of first ones of the plurality of contacts connecting the first common source line to the source strapping line is different from a number of second ones of the plurality of contacts connecting the second common source line to the source strapping line.

12. The semiconductor memory device of claim 10, further comprising:
a plurality of conductive lines on the plurality of vertical channel structures and the first and second common source lines,
wherein each of the first and second common source lines is connected to the source strapping line through at least two of the plurality of conductive lines.

13. The semiconductor memory device of claim 10, wherein the plurality of bit lines comprises odd-numbered bit lines and even-numbered bit lines arranged in the first direction in an alternating sequence,
wherein each of the odd-numbered bit lines is connected to a respective one of first ones of the plurality of contacts overlapping the first common source line in plan view, and
wherein each of the even-numbered bit lines is connected to a respective one of second ones of the plurality of contacts overlapping the second common source line in plan view.

14. The semiconductor memory device of claim 10, wherein the source strapping line overlaps the at least two of the plurality of contacts and one of the first and second common source lines.

15. The semiconductor memory device of claim 10, wherein a lower surface of the source strapping line and lower surfaces of the plurality of bit lines are disposed at an equal level.

16. The semiconductor memory device of claim 10, further comprising:
a plurality of conductive lines on the plurality of vertical channel structures and the first and second common source lines,
wherein the plurality of conductive lines extend in the second direction, and
wherein each of the plurality of conductive lines has an offset portion that is offset from the second direction and overlaps one of the first and second common source lines.

17. A semiconductor device comprising:
first and second common source lines on a substrate, the first and second common source lines extending in a first direction;
an electrode structure between the first and second common source lines on the substrate, the electrode structure comprising a plurality of electrodes vertically staked on the substrate;
a plurality of vertical channel structures extending through the electrode structure;
a plurality of bit lines crossing over the first and second common source lines and the electrode structure, a respective one of the plurality of bit lines being electrically connected to a respective one of the plurality of vertical channel structures; and
a source strapping line crossing over the first and second common source lines and the electrode structure, the source strapping line being electrically connected to the first and second common source lines and a lowermost surface of the source strapping line being coplanar with lowermost surfaces of the plurality of bit lines,
wherein the source strapping line is between a first one of the plurality of bit lines and a second one of the plurality of bit lines and is spaced apart from both the first one of the plurality of bit lines and the second one of the plurality of bit lines in plan view.

18. The device of claim 17 further comprising a plurality of conductive lines extending in a second direction crossing the first direction,
wherein a respective one of the plurality of conductive lines electrically connects a respective one of the plurality of bit lines to a respective one of the plurality of vertical channel structures,
wherein the plurality of conductive lines comprise first ones of the plurality of conductive lines that cross over the first common source line and second ones of the plurality of conductive lines that cross over the second common source line,
wherein each of the first ones of the plurality of conductive lines comprises a first offset portion that overlaps the first common source line in plan view and is offset from the second direction toward the first direction, and
wherein each of the second ones of the plurality of conductive lines comprises a second offset portion that overlaps the second common source line in plan view and is offset from the second direction toward a third direction that is opposite the first direction.

19. The device of claim 18, wherein the plurality of bit lines comprises first ones of the plurality of bit lines and second ones of plurality of bit lines arranged in the first direction in an alternating sequence, and
wherein a respective one of the first ones of the plurality of bit lines is electrically connected to a respective one of the first ones of the plurality of conductive lines, and a respective one of the second ones of the plurality of bit lines is electrically connected to a respective one of the second ones of the plurality of conductive lines.

20. The device of claim 17 further comprising a plurality of conductive contacts that comprises first ones of the plurality of conductive contacts overlapping the first common source line in plan view and second ones of the plurality of conductive contacts overlapping the second common source line in plan view,
wherein the plurality of bit lines comprises first ones of the plurality of bit lines and second ones of plurality of bit lines arranged in the first direction in an alternating sequence, and
wherein a respective one of the first ones of the plurality of bit lines contacts a respective one of the first ones of the plurality of conductive contacts, and a respective one of the second ones of the plurality of bit lines contacts a respective one of the second ones of the plurality of conductive contacts.

* * * * *